*(12)* United States Patent
Anderson et al.

(10) Patent No.: US 9,023,694 B2
(45) Date of Patent: May 5, 2015

(54) BODY CONTACTED HYBRID SURFACE SEMICONDUCTOR-ON-INSULATOR DEVICES

(71) Applicant: International Business Machines Corporation, Armonk, NY (US)

(72) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 13/774,573

(22) Filed: Feb. 22, 2013

(65) Prior Publication Data

US 2013/0171780 A1    Jul. 4, 2013

Related U.S. Application Data

(60) Continuation of application No. 13/454,518, filed on Apr. 24, 2012, which is a division of application No. 12/342,373, filed on Dec. 23, 2008, now Pat. No. 8,227,867.

(51) Int. Cl.
*H01L 21/00* (2006.01)
*H01L 29/78* (2006.01)
*H01L 29/66* (2006.01)

(52) U.S. Cl.
CPC ...... *H01L 29/7841* (2013.01); *H01L 29/66795* (2013.01); *H01L 29/785* (2013.01)

(58) Field of Classification Search
CPC ...... H01L 29/78; H01L 29/7841; H01L 21/00
USPC ......... 438/151, 164, 319, 197, 283, 284, 157, 438/299, 301, 275, 238
See application file for complete search history.

(56) References Cited

U.S. PATENT DOCUMENTS 4,965,213 A    10/1990   Blake
5,821,575 A    10/1998   Mistry et al.
(Continued)

FOREIGN PATENT DOCUMENTS

CN        1695227 A      11/2005
JP    2002-261292 A       9/2002
(Continued)

OTHER PUBLICATIONS

Yunlong et al., "Floating Body Effect in Partially Depleted SOI nMOSFET with Asymmetric Structure and Ge-implantation" Chinese Journal of Semiconductors (Nov. 2002) pp. 1154-1157, vol. 23, No. 11.
(Continued)

*Primary Examiner* — Choung A Luu
(74) *Attorney, Agent, or Firm* — Scully, Scott, Murphy & Presser, P.C.; Richard M. Kotulak, Esq.

(57) ABSTRACT

A portion of a top semiconductor layer of a semiconductor-on-insulator (SOI) substrate is patterned into a semiconductor fin having substantially vertical sidewalls. A portion of a body region of the semiconductor fin is exposed on a top surface of the semiconductor fin between two source regions having a doping of a conductivity type opposite to the body region of the semiconductor fin. A metal semiconductor alloy portion is formed directly on the two source regions and the top surface of the exposed body region between the two source regions. The doping concentration of the exposed top portion of the body region may be increased by ion implantation to provide a low-resistance contact to the body region, or a recombination region having a high-density of crystalline defects may be formed. A hybrid surface semiconductor-on-insulator (HSSOI) metal-oxide-semiconductor-field-effect-transistor (MOSFET) thus formed has a body region that is electrically tied to the source region.

20 Claims, 40 Drawing Sheets

(56) References Cited

U.S. PATENT DOCUMENTS

| | | |
|---|---|---|
| 6,300,182 B1 | 10/2001 | Yu |
| 6,466,489 B1 | 10/2002 | Ieong et al. |
| 6,534,373 B1 | 3/2003 | Yu |
| 6,774,437 B2 | 8/2004 | Bryant et al. |
| 6,790,749 B2 | 9/2004 | Takemura et al. |
| 6,800,885 B1 | 10/2004 | An et al. |
| 6,867,433 B2 | 3/2005 | Yeo et al. |
| 6,967,143 B2 | 11/2005 | Mathew et al. |
| 7,098,502 B2 | 8/2006 | Mathew et al. |
| 7,098,507 B2 | 8/2006 | Tang et al. |
| 7,138,305 B2 | 11/2006 | Datta et al. |
| 7,141,480 B2 | 11/2006 | Adam et al. |
| 7,163,851 B2 | 1/2007 | Abadeer et al. |
| 7,176,073 B2 | 2/2007 | Bhattacharyya |
| 7,183,164 B2 | 2/2007 | Haller |
| 7,217,978 B2 | 5/2007 | Joshi et al. |
| 7,241,649 B2 | 7/2007 | Donze et al. |
| 7,244,640 B2 | 7/2007 | Yang et al. |
| 7,262,086 B2 | 8/2007 | Yeo et al. |
| 7,550,773 B2 | 6/2009 | Booth, Jr. et al. |
| 2006/0011984 A1* | 1/2006 | Currie ............ 257/352 |
| 2006/0057787 A1 | 3/2006 | Doris et al. |
| 2008/0042219 A1 | 2/2008 | Booth et al. |
| 2008/0150026 A1* | 6/2008 | Kwon et al. .......... 257/347 |
| 2009/0008705 A1 | 1/2009 | Zhu et al. |
| 2010/0127327 A1 | 5/2010 | Chidambarrao |

FOREIGN PATENT DOCUMENTS

| | | |
|---|---|---|
| JP | 2006-013303 A | 1/2006 |
| JP | 2007-042790 A | 2/2007 |
| WO | 2006-006424 A1 | 1/2006 |

OTHER PUBLICATIONS

Rui-Zhen et al., "Novel BTS Structure Technology for Partially Depleted SOI MOSFET" Chinese Journal of Electron Devices *Dec. 2005) pp. 730-732, vol. 28, No. 4.

Letter from IBM Japan which indicates that the date of the issued Office Action is Nov. 12, 2013.

Office Action dated Jun. 20, 2014 received in a related U.S. Appl. No. 13/454,518.

* cited by examiner

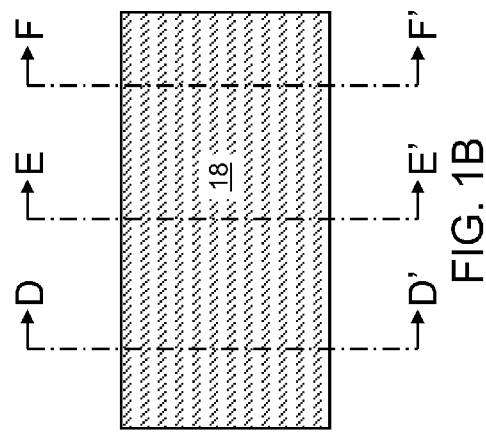
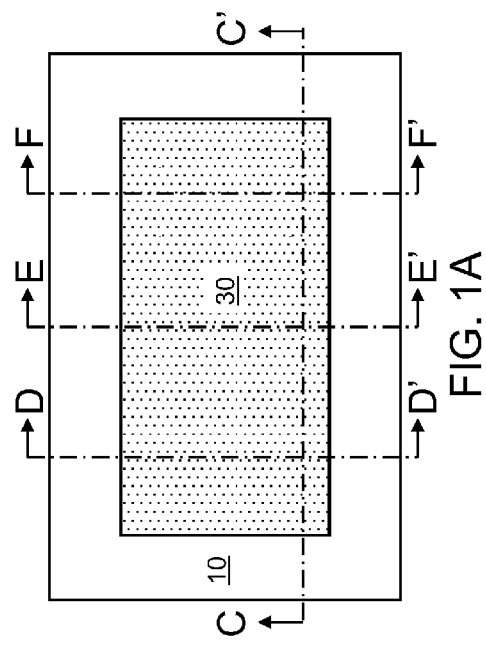
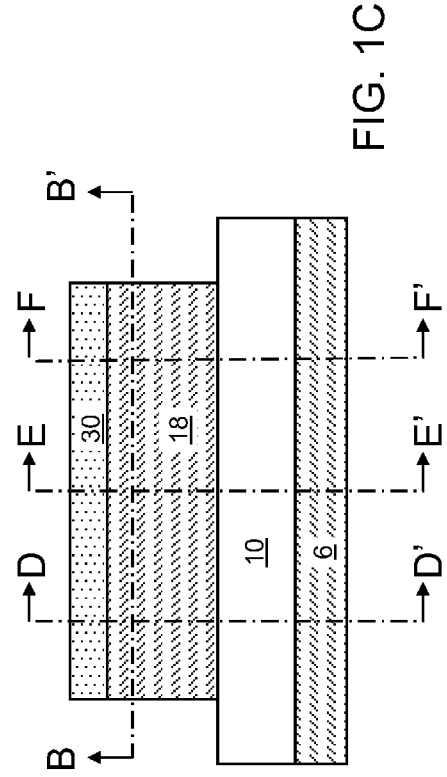

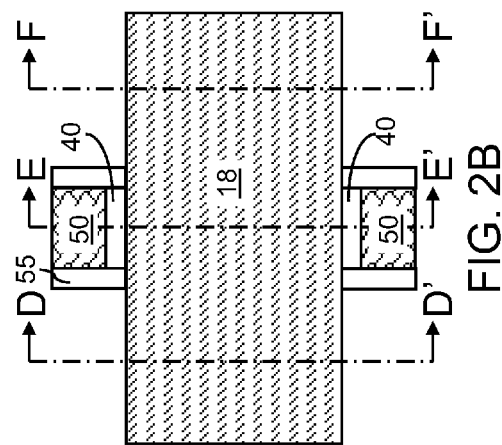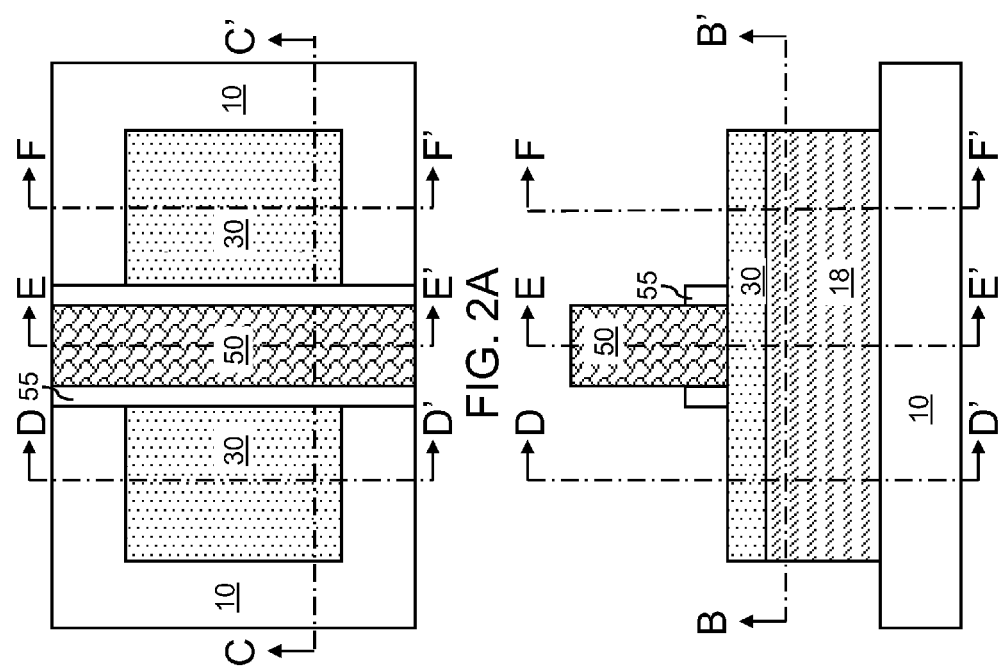

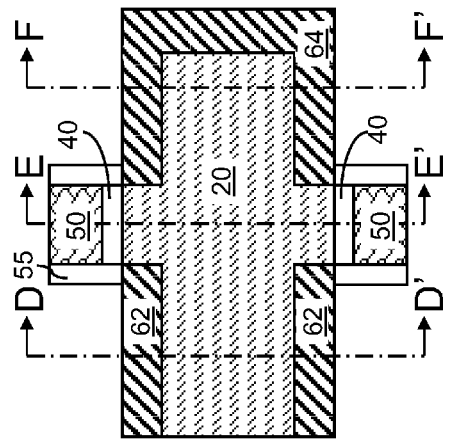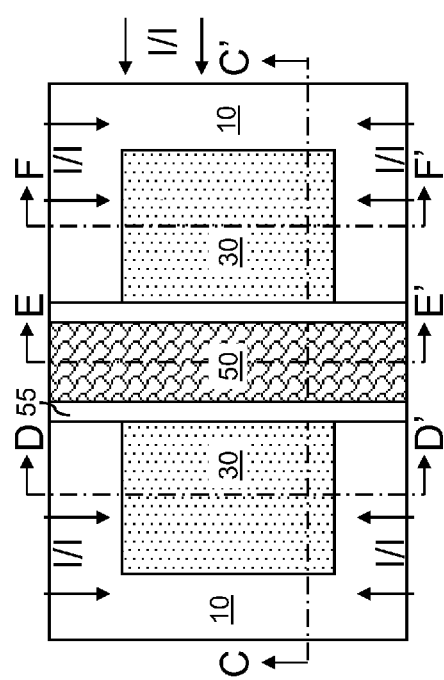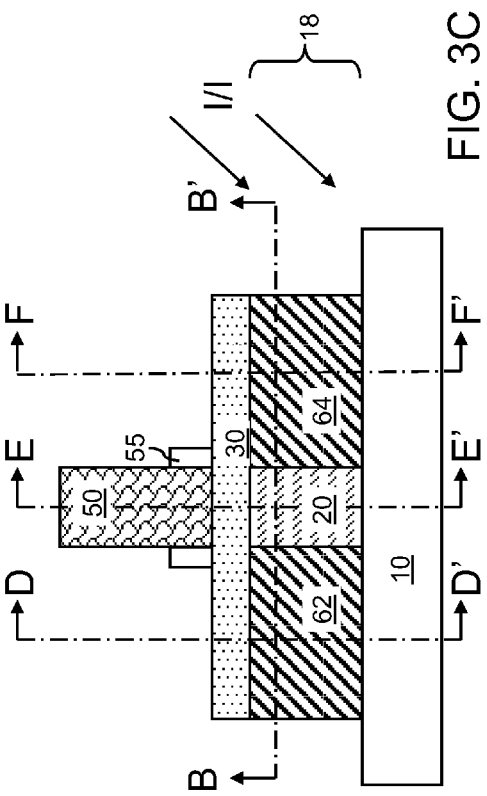

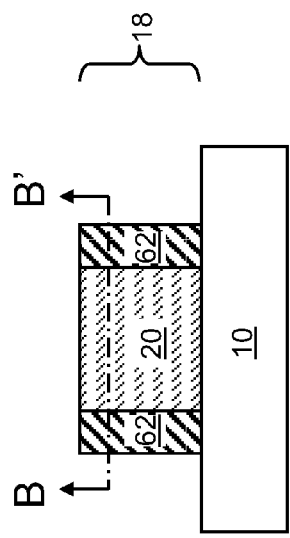
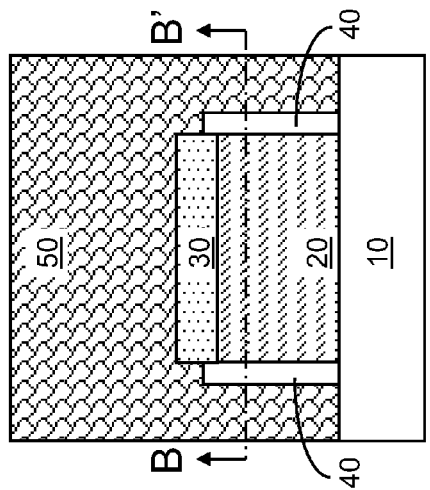
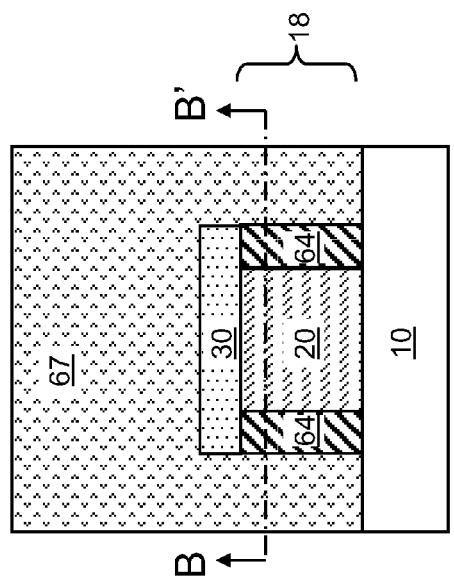

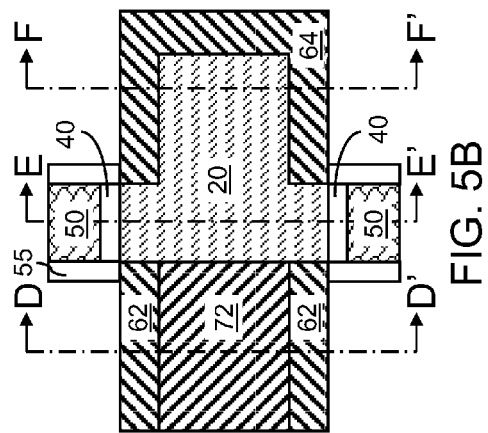
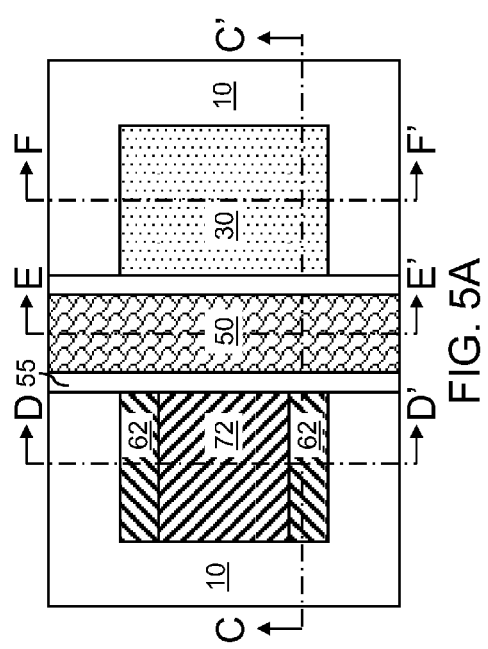
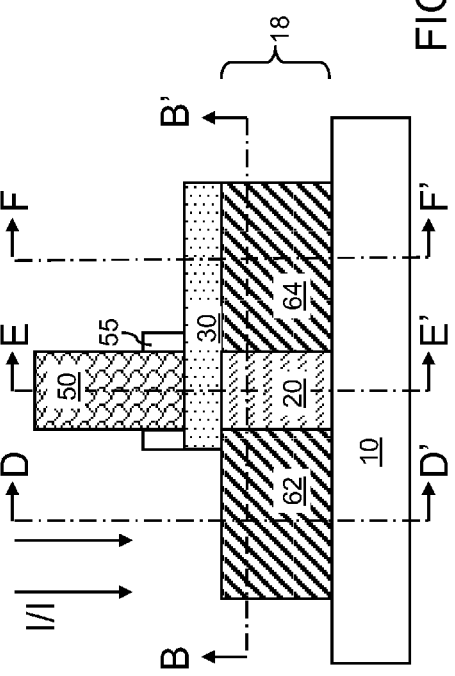

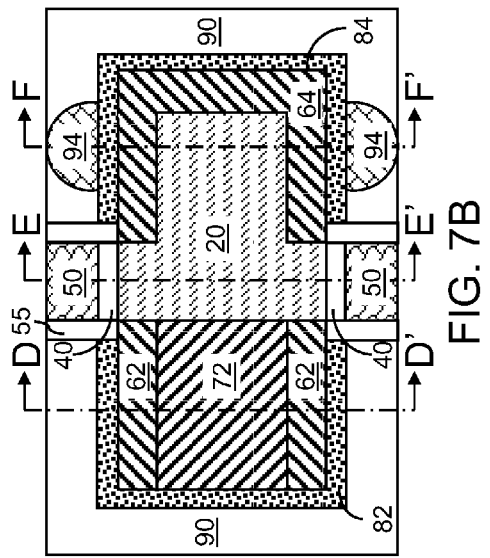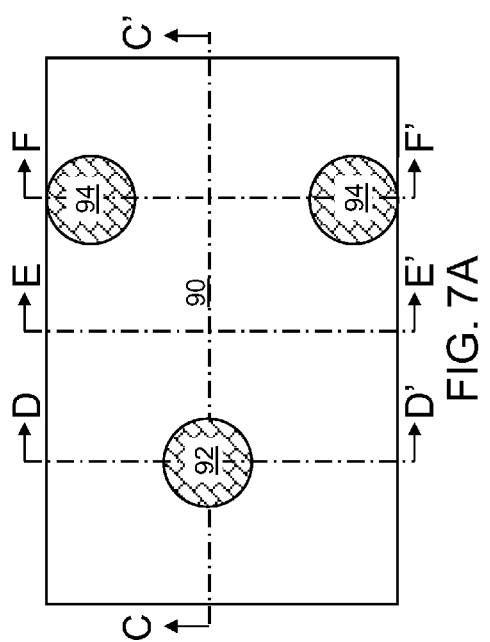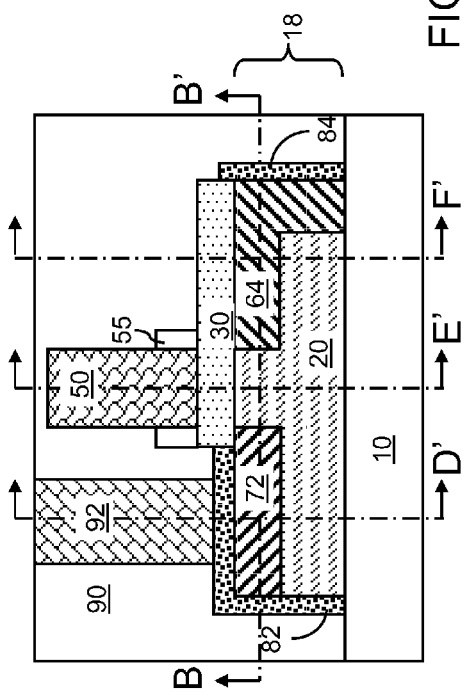

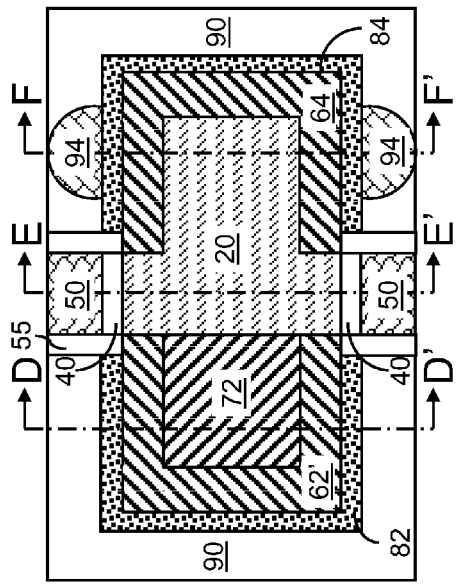
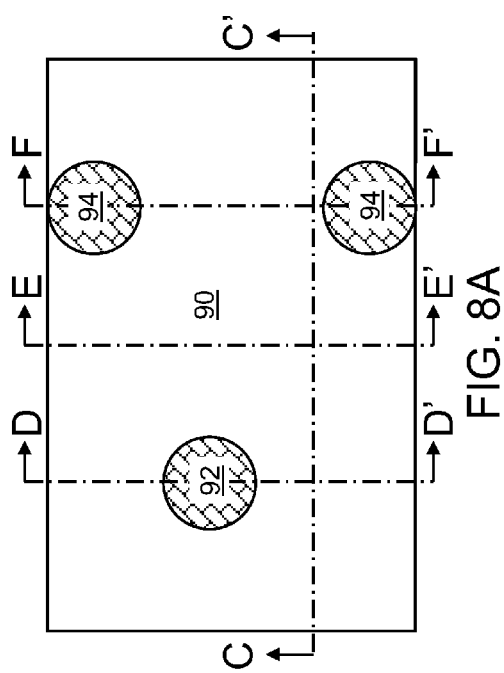
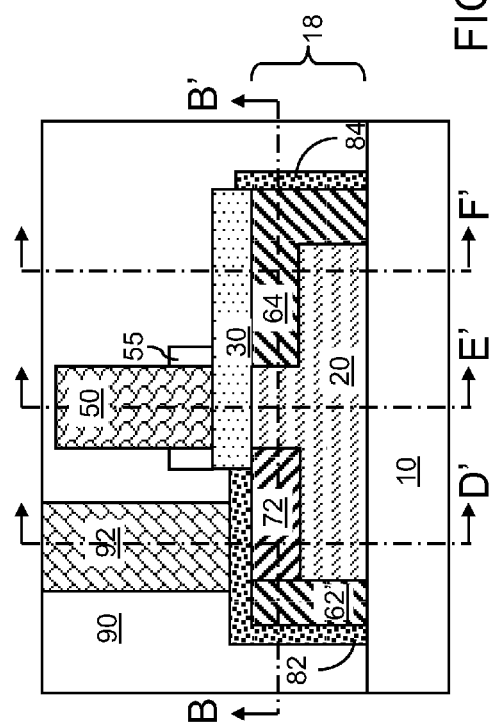
FIG. 8A
FIG. 8B
FIG. 8C

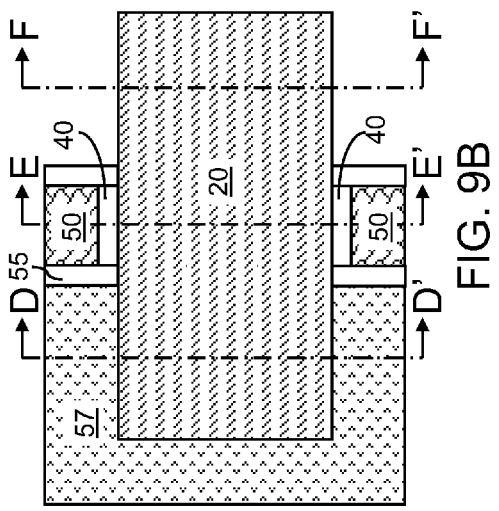
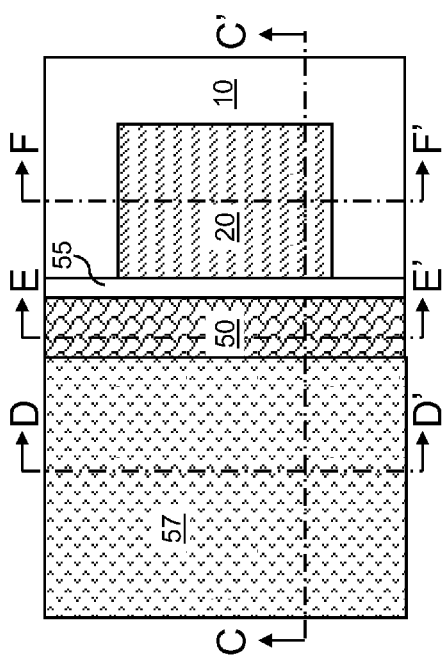
FIG. 9A
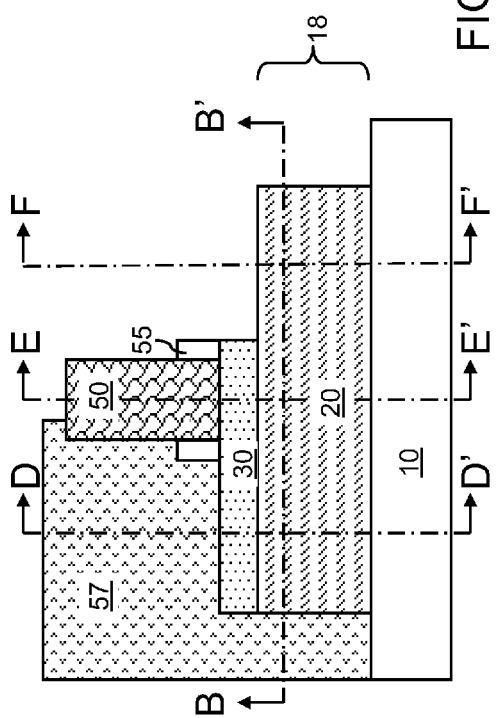
FIG. 9B
FIG. 9C

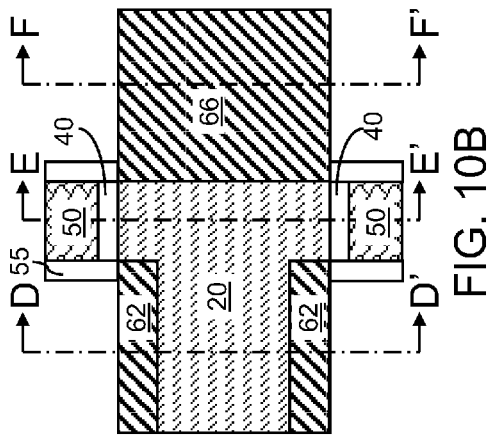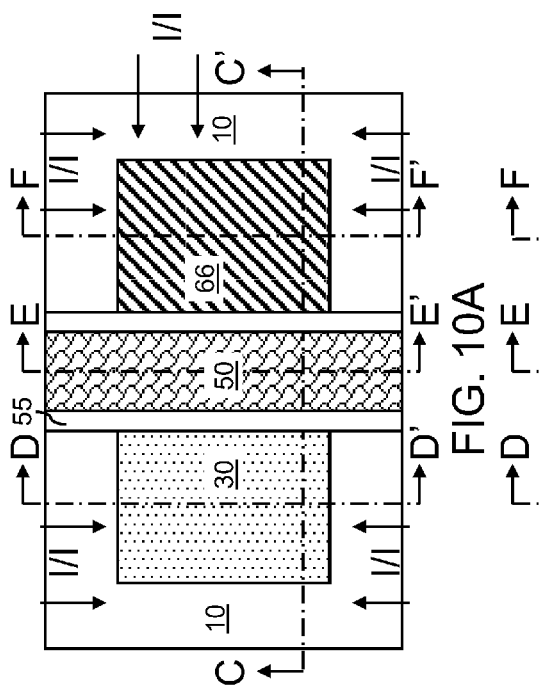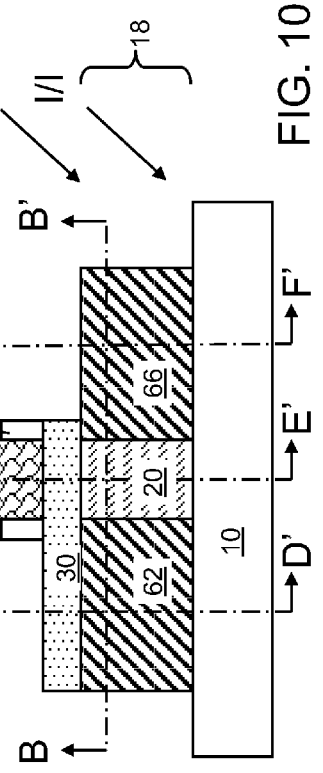

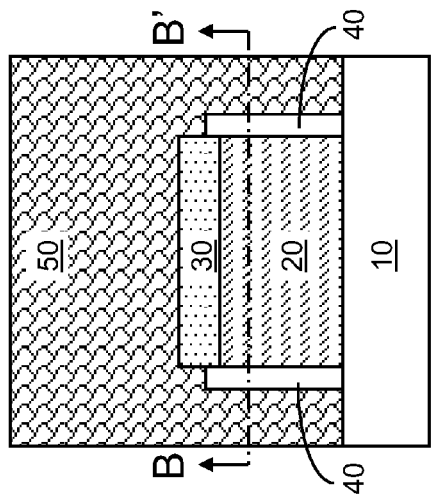
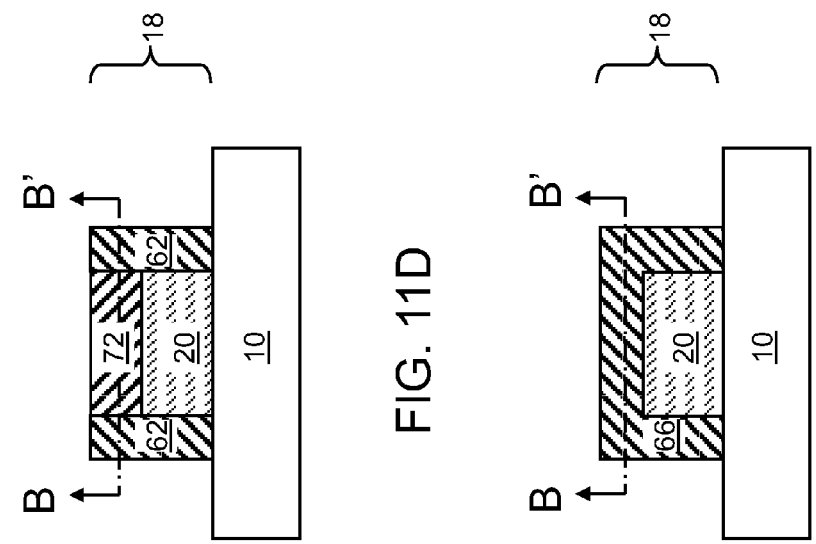

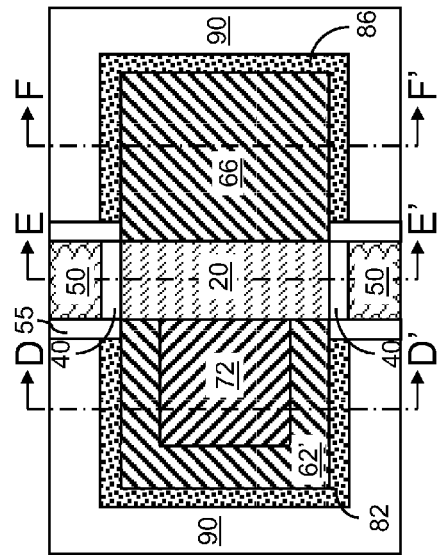
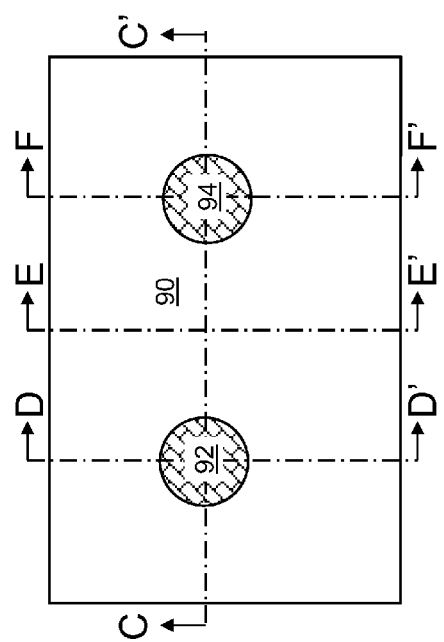
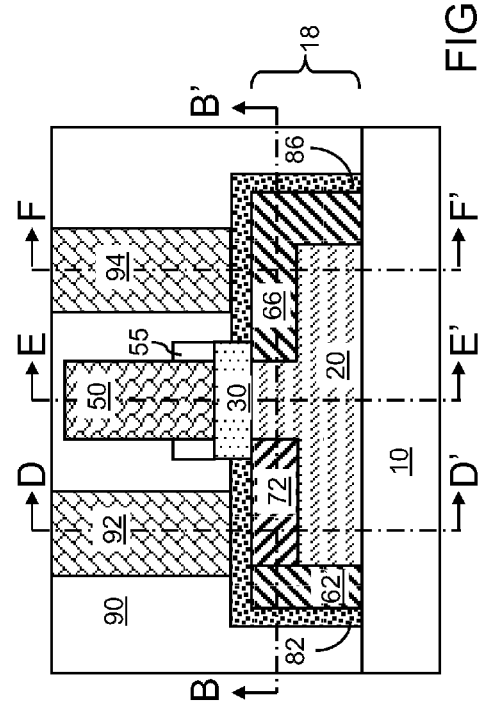

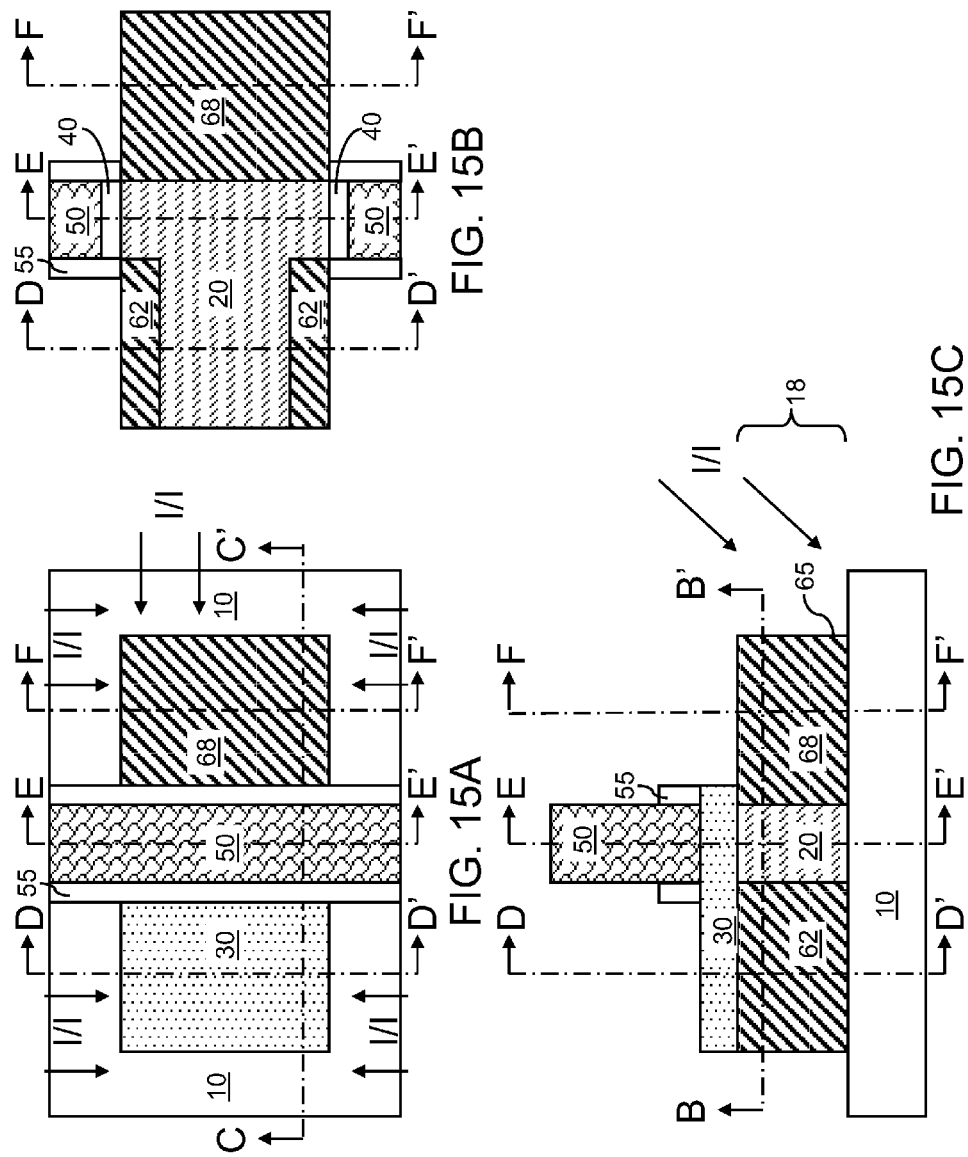

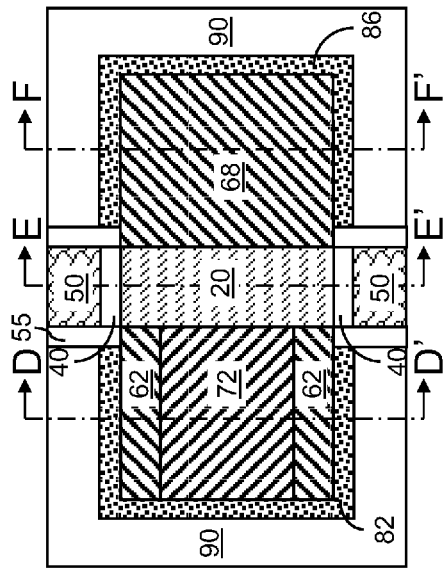
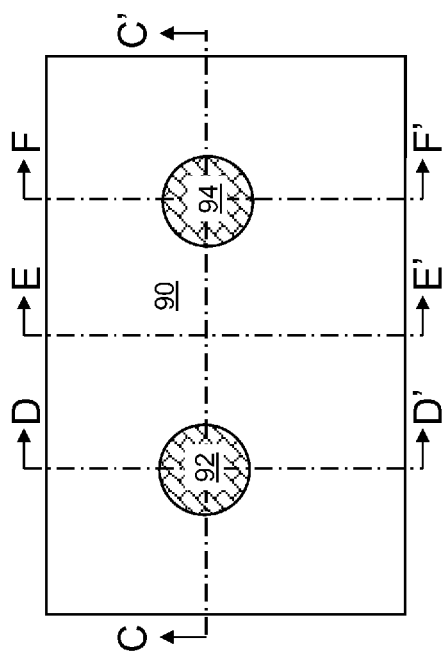
FIG. 16A
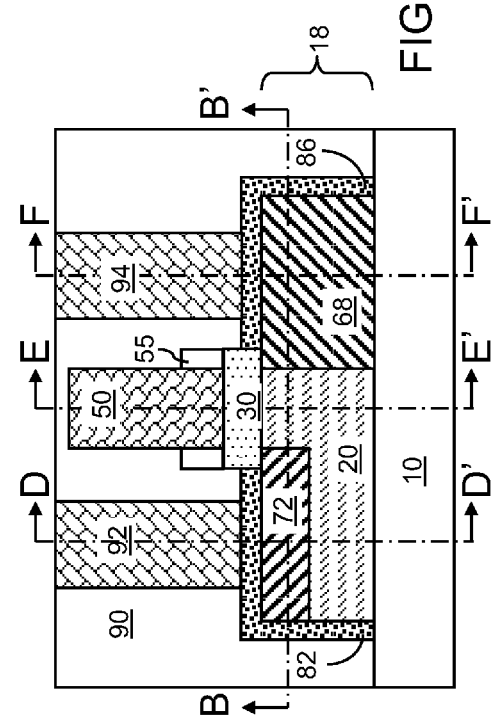
FIG. 16B
FIG. 16C

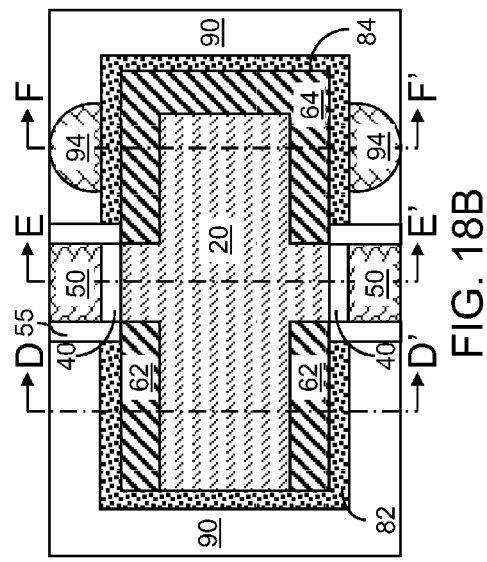
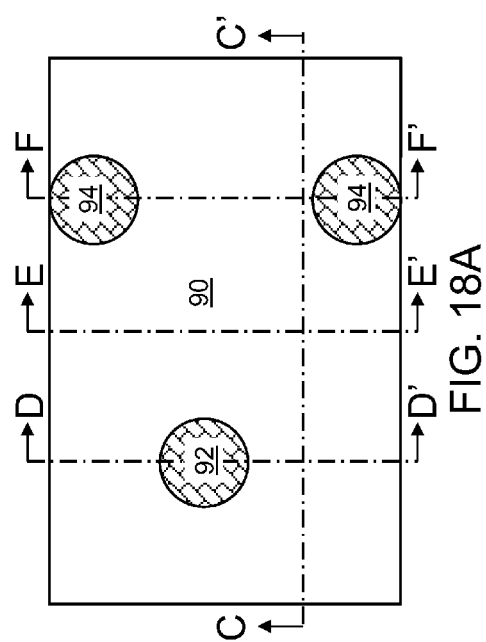
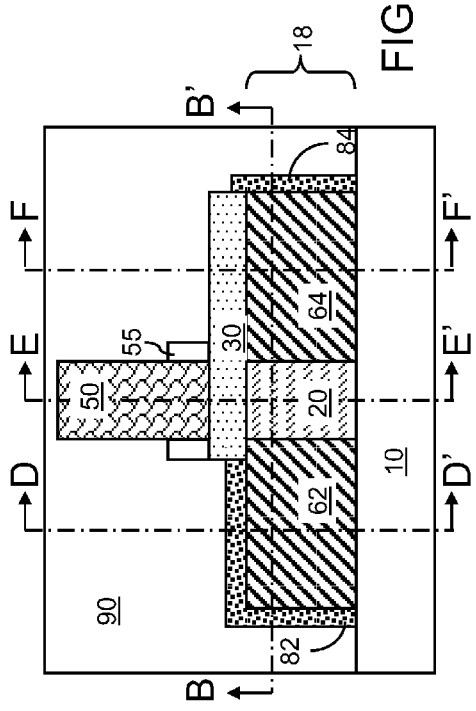
FIG. 18A
FIG. 18B
FIG. 18C

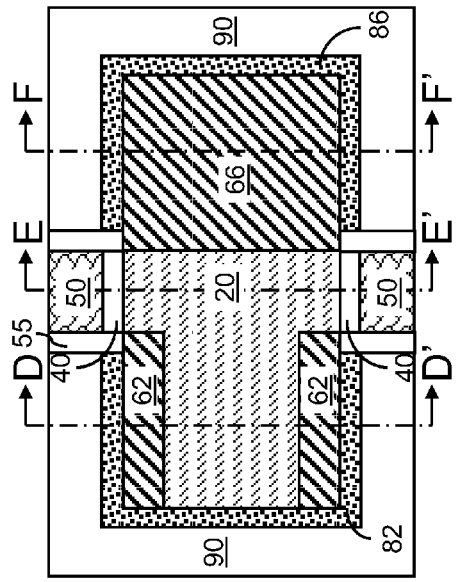
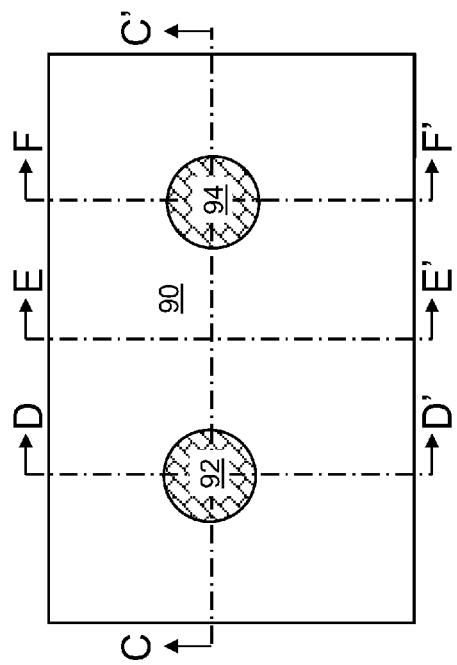
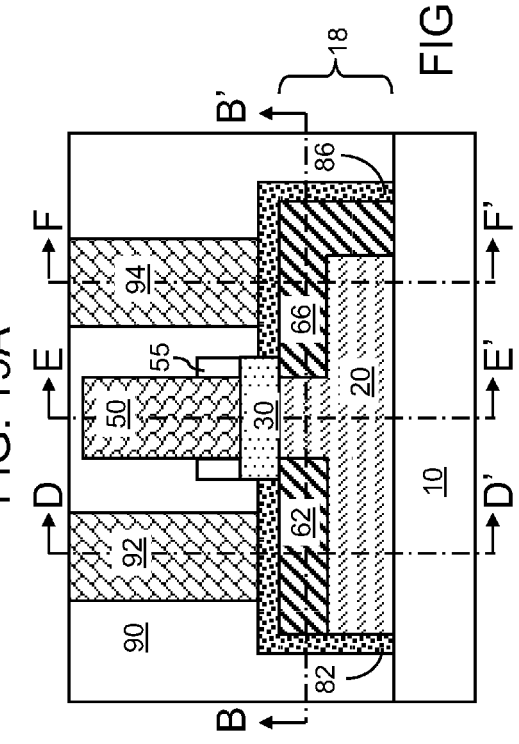
FIG. 19A
FIG. 19B
FIG. 19C

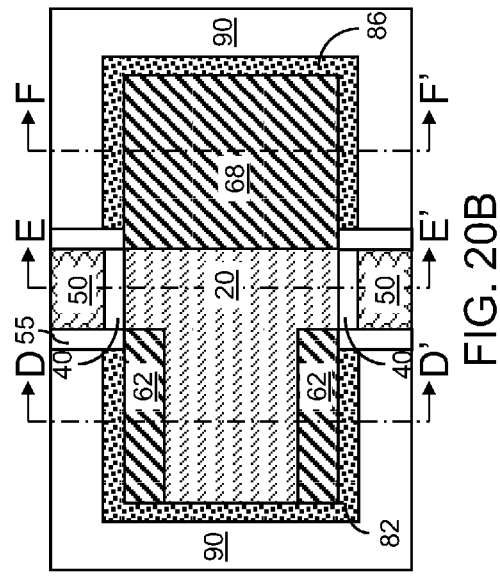
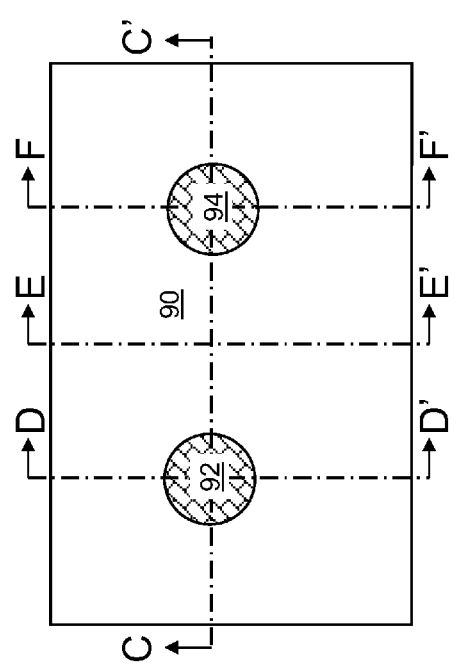
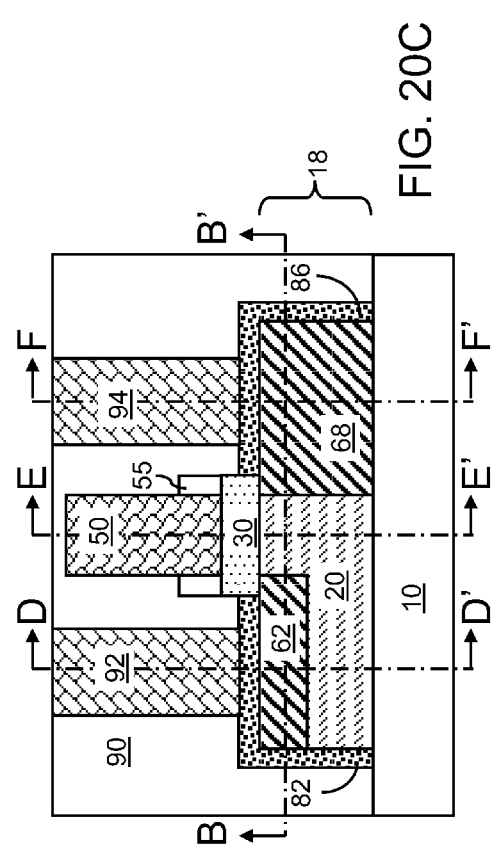

BODY CONTACTED HYBRID SURFACE SEMICONDUCTOR-ON-INSULATOR DEVICES

CROSS REFERENCE TO RELATED APPLICATION

This application is a continuation of U.S. patent application Ser. No. 13/454,518 filed on Apr. 24, 2012, which is a divisional of U.S. patent application Ser. No. 12/342,373, filed Dec. 23, 2008 the entire content and disclosure of which is incorporated herein by reference.

BACKGROUND

The present invention relates to semiconductor devices, and particularly, to body contacted hybrid surface semiconductor-on-insulator (HSSOI) devices formed on a semiconductor-on-insulator (SOI) substrate and methods of manufacturing the same.

Hybrid surface semiconductor-on-insulator (HSSOI) devices refer to semiconductor devices formed employing a sidewall of a top semiconductor layer of a semiconductor-on-insulator (SOI) substrate. HSSOI devices may be formed on the same SOI substrate as a planar semiconductor device employing a semiconductor surface that is parallel to a top surface of the top semiconductor layer.

Electrical characteristics of the HSSOI devices display features of typical SOI devices. Particularly, the floating body effect may place a limitation on performance parameters of HSSOI devices. An important factor in optimizing the power and performance advantages of HSSOI devices is precise control of the voltage of the floating body.

BRIEF SUMMARY

An embodiment of the present invention provides a hybrid surface semiconductor-on-insulator (HSSOI) metal-oxide-semiconductor field effect transistor (MOSFET) having a body electrically tied to a source, thereby minimizing or eliminating the floating body effect of the HSSOI MOSFET.

According to an aspect of the present invention, a portion of a top semiconductor layer of a semiconductor-on-insulator (SOI) substrate is patterned into a semiconductor fin having substantially vertical sidewalls. A portion of a body region of the semiconductor fin is exposed on a top surface of the semiconductor fin between two source regions having a doping of a conductivity type opposite to the body region of the semiconductor fin. A metal semiconductor alloy portion is formed directly on the two source regions and the top surface of the exposed body region between the two source regions. The doping concentration of the exposed top portion of the body region may be increased by ion implantation to provide a low resistance contact to the body region. A hybrid surface semiconductor-on-insulator (HSSOI) metal-oxide-semiconductor field effect transistor (MOSFET) thus formed has a body region that is electrically tied to the source region.

According to another aspect of the present invention, a semiconductor structure is provided, which comprises: a semiconductor fin having a first sidewall, a second sidewall, and a substantially horizontal top surface and located directly on an insulator layer, wherein the first and second sidewalls are substantially parallel to each other and substantially vertical; a body region located within the semiconductor fin and having a doping of a first conductivity type and vertically abutting the insulator layer; a first source region located within a first end of the semiconductor fin and directly on the first sidewall and having a doping of a second conductivity type, wherein the second conductivity type is the opposite of the first conductivity type; a second source region located within the first end of the semiconductor fin and directly on the second sidewall and having a doping of the second conductivity type; and a metal semiconductor alloy portion abutting the first source region, the second source region, and a top surface of a portion of the semiconductor fin having a doping of the first conductivity type and located between the first source region and the second source region.

The semiconductor structure may be a metal-oxide-semiconductor field effect transistor (MOSFET) having a first channel directly beneath the first sidewall and a second channel directly beneath the second sidewall, wherein current flows in a horizontal direction along the first sidewall and the second sidewall in the first channel and the second channel, respectively.

According to another aspect of the present invention, a method of forming a semiconductor structure is provided, which comprises: forming a semiconductor fin having a first sidewall, a second sidewall, and a substantially horizontal top surface and located directly on an insulator layer and having a doping of a first conductivity type, wherein the first and second sidewalls are substantially parallel to each other and substantially vertical; forming a first source region having a doping of a second conductivity type directly on the first sidewall within a first end of the semiconductor fin, wherein the second conductivity type is the opposite of the first conductivity type; forming a second source region having a doping of the second conductivity type directly on the second sidewall within the first end of the semiconductor fin; and forming a metal semiconductor alloy portion directly on the first source region, the second source region, and a top surface of a portion of the semiconductor fin having a doping of the first conductivity type and located between the first source region and the second source region.

An embodiment of the present invention provides a hybrid surface semiconductor-on-insulator (HSSOI) metal-oxide-semiconductor field effect transistor (MOSFET) having a body with selective leakage to a source, thereby optimizing the floating body effect of the HSSOI MOSFET.

According to an aspect of the present invention, a portion of a top semiconductor layer of a semiconductor-on-insulator (SOI) substrate is patterned into a semiconductor fin having substantially vertical sidewalls. A portion of a body region of the semiconductor fin is exposed on a top surface of the semiconductor fin between two source regions having a doping of a conductivity type opposite to the body region of the semiconductor fin. A generation/recombination region is formed by at least one of several means. In one embodiment a region having a high density of crystalline defects is formed by amorphizing the exposed body region. A metal semiconductor alloy portion is formed directly on the two source regions and the recombination region between the two source regions. The recombination region facilitates removal of electrical charges in the body region by increasing the recombination rate of electrons and holes, thereby reducing or eliminating floating body effect. Alternatively, a metal-semiconductor interface over the exposed body region provides generation/recombination centers. A hybrid surface semiconductor-on-insulator (HSSOI) metal-oxide-semiconductor field effect transistor (MOSFET) thus formed has a body region that preferentially has increased electrical leakage to the source. This allows increased body doping while maintaining low forward voltage on the body with respect to the source.

According to another aspect of the present invention, a semiconductor structure is provided, which comprises: a semiconductor fin having a first sidewall, a second sidewall, and a substantially horizontal top surface and located directly on an insulator layer of a substrate, wherein the first and second sidewalls are substantially parallel to each other and substantially vertical; a body region located within the semiconductor fin and having a doping of a first conductivity type and vertically abutting the insulator layer; a recombination-center-containing semiconductor region located directly underneath the substantially horizontal top surface and including an amorphized semiconductor material having a doping of the first conductivity type; and a metal semiconductor alloy portion abutting the recombination-center-containing semiconductor region and at least one source region that is located within the semiconductor fin and having a doping of a second conductivity type, wherein the second conductivity type is the opposite of the first conductivity type.

The semiconductor structure may further comprise another metal semiconductor alloy portion abutting the drain region at the first sidewall, the second sidewall, and the end wall.

The first source region may not abut the second source region and may be separated from the second source region by the body region. Alternately, the first source region and the second source region may be of integral and unitary construction.

According to another aspect of the present invention, a method of forming a semiconductor structure is provided, which comprises: forming a semiconductor fin having a first sidewall, a second sidewall, and a substantially horizontal top surface and located directly on an insulator layer and having a doping of a first conductivity type, wherein the first and second sidewalls are substantially parallel to each other and substantially vertical; forming a recombination-center-containing semiconductor region directly underneath the substantially horizontal top surface and including an amorphized semiconductor material and having a doping of the first conductivity type; and forming a metal semiconductor alloy portion directly on the recombination-center-containing semiconductor region and at least one source region formed within the semiconductor fin and having a doping of a second conductivity type, wherein the second conductivity type is the opposite of the first conductivity type.

BRIEF DESCRIPTION OF THE SEVERAL VIEWS OF THE DRAWINGS

For all of the figures herein, the following conventions apply. Figures with the same numeric label correspond to the same stage of manufacturing in the same embodiment. Figures with the suffix "A" are top-down views. Figures with the suffix "B" are horizontal cross-sectional views along the plane B-B'. Figures with the suffix "C," "D," "E," or "F" are vertical cross-sectional views along the plane C-C', D-D', E-E', or F-F', respectively, of the corresponding figure with the same numeric label and the suffix "A."

FIGS. 8A-8F are various views of a variation of the first exemplary HSSOI MOSFET structure according to the first embodiment of the present invention.

FIGS. 14A-14F are various views of a variation of the second exemplary HSSOI MOSFET structure according to the second embodiment of the present invention.

FIGS. 18A-18F are various views of a fourth exemplary HSSOI MOSFET structure according to the fourth embodiment of the present invention.

FIGS. 19A-19F are various views of a fifth exemplary HSSOI MOSFET structure according to the fifth embodiment of the present invention.

FIGS. 20A-20F are various views of a sixth exemplary HSSOI MOSFET structure according to the sixth embodiment of the present invention.

DETAILED DESCRIPTION

Figure 1E:
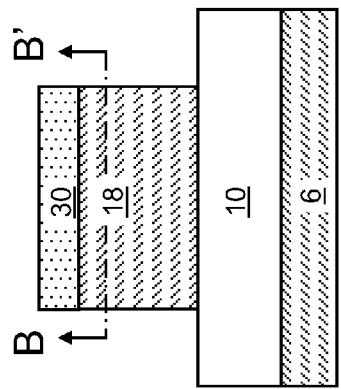
FIGS. 1A-7F are sequential views of a first exemplary hybrid surface semiconductor-on-insulator (HSSOI) metal-oxide-semiconductor field effect transistor (MOSFET) structure according to a first embodiment of the present invention.

As stated above, embodiments of the present invention relate to body contacted hybrid surface semiconductor-on-insulator (HSSOI) devices formed on a semiconductor-on-insulator (SOI) substrate and methods of manufacturing the same, which are described herein with accompanying figures. Throughout the drawings, the same reference numerals or letters are used to designate like or equivalent elements. The drawings are not necessarily drawn to scale.

Figure 1D:
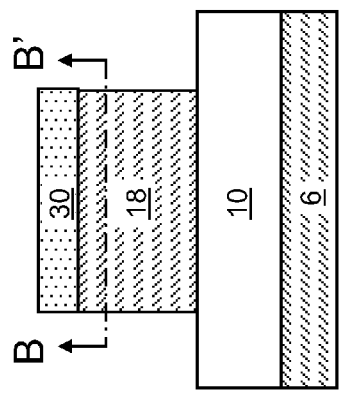
Figure 1F:
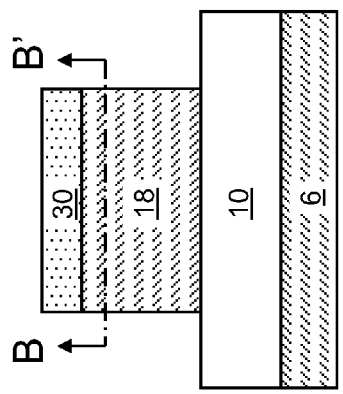

Referring to FIGS. 1A-1F, a first exemplary semiconductor structure comprises a handle substrate 6, an insulator layer 10, a semiconductor fin 18, and a dielectric fin cap portion 30. The stack of the handle substrate 6, the insulator layer 10, and the semiconductor fin 18 may be formed by patterning a top semiconductor layer of a semiconductor-on-insulator (SOI) substrate. For example, an SOI comprising the handle substrate 6, the insulator layer 10, and a top semiconductor layer may be employed. In this case, the insulator layer 10 is a buried insulator layer of the SOI substrate vertically abutting the handle substrate and the top semiconductor layer.

The handle substrate 6 may comprise a semiconductor material, an insulator material, or a metallic material. For example, the handle substrate may comprise single crystalline semiconductor material such as silicon. The insulator layer 10 comprises a dielectric material such as silicon oxide or silicon nitride, or a semiconductor layer doped or damaged to be substantially electrically insulating. The top semiconductor layer comprises a semiconductor material. Preferably, the top semiconductor material comprises a single crystalline semiconductor material having an epitaxial alignment among atoms within the entirety of the top semiconductor layer. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise single crystalline silicon. The thickness of the top semiconductor layer may range from 1 nm to 2000 nm, or possibly 10 nm to 200 nm, and typically from about 30 nm to about 120 nm, although lesser and greater thicknesses are also contemplated herein.

The semiconductor material within the top semiconductor layer may be doped with electrical dopants of a first conductivity type. In the case where the first conductivity type is p-type, the electrical dopants may be at least one of p-type dopants such as B, Ga, and In. In the case where the first conductivity type is n-type, the electrical dopants may be at least one of n-type dopants such as P, As, and Sb. Typically, the concentration of the electrical dopants may range from $1.0 \times 10^{13}$ atoms/cm$^3$ to $1.0 \times 10^{20}$ atoms/cm$^3$, or possibly $1.0 \times 10^{14}$ atoms/cm$^3$ to $1.0 \times 10^{19}$ atoms/cm$^3$, although lesser and greater concentrations are also contemplated herein.

The top semiconductor layer may have a built-in stress in the plane perpendicular to the direction of the surface normal of an uppermost surface of the top semiconductor layer. In addition or alternately, the top semiconductor layer may have a built-in stress along the direction of the surface normal of the uppermost surface of the top semiconductor layer. Embodiments of the present invention may be implemented in an SOI portion of a hybrid substrate that contains a bulk portion and the SOI portion. Such variations are explicitly contemplated herein.

The top surface of the semiconductor layer may be on a <100> oriented silicon plane and the sidewalls on <110> silicon planes, with current in the <110> direction. Alternatively the top surface may be a <110> plane with current in a <110> direction and the sidewalls on <100> type directions.

A dielectric fin cap layer is formed on the top surface of the top semiconductor layer. The dielectric fin cap layer comprises a dielectric material such as a dielectric oxide, a dielectric nitride, or a dielectric oxynitride. For example, the dielectric fin cap layer comprises silicon nitride or silicon oxide. The thickness of the dielectric fin cap layer may range from 0.5 nm to 1000 nm, or possibly 5 nm to 100 nm, and typically from about 15 nm to about 50 nm, although lesser and greater thicknesses are also contemplated herein. The dielectric fin cap layer may comprise a single homogeneous dielectric material, or may comprise a vertical stack of at least two dielectric material layers having different compositions.

The stack of the dielectric fin cap layer and the top semiconductor layer is lithographically patterned to form a laterally isolated structure, which comprises a vertical stack of the semiconductor fin 18 and the dielectric fin cap portion 30. Specifically, a remaining portion of the top semiconductor layer constitutes the semiconductor fin 18, and a remaining portion of the dielectric fin cap layer constitutes the dielectric fin cap portion 30.

The semiconductor fin 18 has a pair of substantially vertical sidewalls which are parallel to each other. One of the pair of substantially vertical sidewalls is herein referred to as a "first sidewall," and the other of the pair of substantially vertical sidewalls is herein referred to as a "second sidewall." The semiconductor fin 18 may have another pair of substantially vertical sidewalls, wherein are herein referred to as a first end wall and a second end wall. Each of the first and second end walls adjoins the first sidewall and the second sidewall. The first sidewall, the second sidewall, the first end wall, and the second end wall of the semiconductor fin 18 are substantially vertically coincident with sidewalls of the dielectric fin cap portion 30. In all figures with the suffix "B," the first sidewall wall is located on a bottom side of the semiconductor fin 18 as represented in the two dimensional drawing, and the second sidewall is located on a top side of the semiconductor fin 18 as represented in the two dimensional drawing. In all figures with the suffix "C," the first end wall is located on the left side of the semiconductor fin 18 as represented in the two dimensional drawing, and the second end wall is located on the right side of the semiconductor fin 18 as represented in the two dimensional drawing.

Figure 2E:
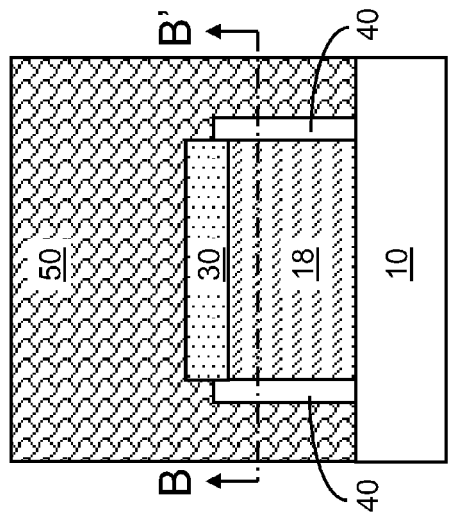
Figure 2D:
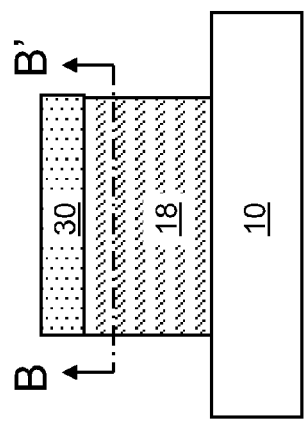
Figure 2F:
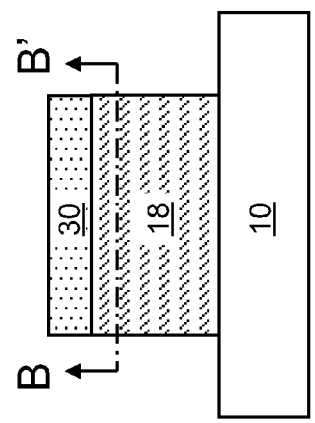

Referring to FIGS. 2A-2F, gate dielectrics 40 and a gate conductor 50 are formed on the stack of the semiconductor fin 18 and the dielectric fin cap portion 30. While the bottom semiconductor layer 6 is omitted in FIGS. 2A-2F and in all subsequent drawings herein for conciseness, the presence of the bottom semiconductor layer 6 directly underneath the insulator layer 10 is presumed in all the figures hereafter.

The gate dielectrics 40 include a first gate dielectric located directly on the first sidewall of the semiconductor fin 18 and a second gate dielectric located directly on the second sidewall of the semiconductor fin 18. The gate dielectrics 40 may comprise a semiconductor-based dielectric material such as silicon oxide, silicon nitride, silicon oxynitride, and/or a stack thereof. The semiconductor-based dielectric material may be formed by thermal conversion of exposed portions of the semiconductor fin 18 and/or by chemical vapor deposition (CVD). Alternately, the gate dielectrics 40 may comprise a high-k dielectric material such as HfO$_2$, ZrO$_2$, La$_2$O$_3$, Al$_2$O$_3$, TiO$_2$, SrTiO$_3$, LaAlO$_3$, Y$_2$O$_3$, an alloy thereof, and a silicate thereof. The high-k dielectric material may be formed by methods well known in the art including, for example, a chemical vapor deposition (CVD), an atomic layer deposition (ALD), molecular beam epitaxy (MBE), pulsed laser deposition (PLD), liquid source misted chemical deposition (LSMCD), physical vapor deposition (PVD), etc. The thickness of the gate dielectric 40 may range from 0.1 nm to 60 nm, or possibly 1 nm to 3 nm in the case of a conventional dielectric material, and possibly 2 nm to 6 nm in the case of the high-k dielectric material, and may have an effective oxide thickness on the order of or less than 1 nm to 10 nm.

The gate conductor 50 comprises a conductive material such as a doped semiconductor material, a conductive metallic nitride, a metallic material, or a combination thereof. Exemplary doped semiconductor materials include doped polysilicon, a doped silicon-containing semiconductor alloy, etc. Exemplary conductive metallic nitrides include, but are not limited to, TaN, TiN, TiAlN, other conductive refractory metal nitrides, or alloys thereof. Exemplary metallic materials include elemental metals and intermetallic alloys. The thickness of the gate conductor 50, as measured above a top surface of the dielectric fin cap portion 30, may range from 2 nm to 4000 nm, or possibly 20 nm to 400 nm, and typically from about 40 nm to about 200 nm, although lesser and greater thicknesses are also contemplated herein explicitly. The thickness of the gate conductor 50 is greater than the thickness of the dielectric fin cap portion 30.

The gate dielectrics 40 and the gate conductor 50 may be formed by formation of a gate dielectric layer on the exposed surfaces of the semiconductor fin 18, formation of a gate conductor layer directly on the gate dielectric layer, and lithographic patterning of the stack of the gate conductor layer and the gate dielectric layer. The gate dielectric layer may be formed only on the surfaces of the semiconductor fin 18 and not on the surfaces of the dielectric fin cap portion 30, e.g., if the gate dielectric layer is formed by thermal or plasma conversion of the semiconductor material of the semiconductor fin 18, or may be formed on the surfaces of the semiconductor fin 18 and on the top surface and sidewall surfaces of the dielectric fin cap portion 30, e.g., if the gate dielectric layer is formed by deposition of a dielectric material.

The stack of the gate dielectric layer and the gate conductor are lithographically patterned so that the gate dielectrics 40, which is the remaining portion of the gate dielectric layer, and the gate conductor 50, which is the remaining portion of the gate conductor layer, straddle a middle portion of the semiconductor fin 18 between a first end of the semiconductor fin 18 and a second end of the semiconductor fin 18. Thus, a portion of the first sidewall, a portion of the second sidewall, and the first end wall of the semiconductor fin 18 are exposed in the first end of the semiconductor fin 18 located on one side of the dielectric fin cap portion 30, and another portion of the first sidewall, another portion of the second sidewall, and the second end wall of the semiconductor fin 18 are exposed in the second end of the semiconductor fin 18 located on the other side of the dielectric fin cap portion 30.

The width of the gate dielectrics 40 and the gate conductor 50 along the horizontal direction within the plane of the first and second sidewalls of the semiconductor fin 18 is the gate length of a hybrid surface semiconductor-on-insulator (HSSOI) metal-oxide-semiconductor field effect transistor (MOSFET) to be formed in the first exemplary semiconductor structure.

Optionally, halo ion implantation and/or source and drain extension ion implantations may be performed at this step to form halo regions (not shown) and/or source and drain extension regions (not shown). A gate spacer 55 is formed on the sidewalls of the gate conductor 50 by deposition of a conformal dielectric layer and an anisotropic etch. A remaining portion of the conformal dielectric layer located on the sidewalls of the gate conductor 50 constitutes the gate spacer 55. The gate spacer 55 may laterally surround the gate conductor 50. The gate spacer 55 abuts a top surface of the dielectric fin cap portion 30. The gate spacer 55 may provide an offset between the edges of the gate conductor 50 and source and edges of the drain regions to be subsequently formed.

Depending on the ratio of the height of the exposed portion of the sidewall of the gate conductor 50 above the gate spacer 55 to the total height of the semiconductor fin 18 and the dielectric fin cap portion 30, a residual dielectric spacer (not shown) may, or may not, be formed at the base of the first and second sidewalls and first and second end walls of the semiconductor fin 18. Specifically, if the height of the exposed portion of the sidewall of the gate conductor 50 above the gate spacer 55 is greater than the total height of the semiconductor fin 18 and the dielectric fin cap portion 30, no residual dielectric spacer is formed at the base of the semiconductor fin 18. If the height of the exposed portion of the sidewall of the gate conductor 50 above the gate spacer 55 is less than the total height of the semiconductor fin 18 and the dielectric fin cap portion 30, residual dielectric spacers, which are integrally formed with the gate spacer 55, are formed at the base of the semiconductor fin 18. The residual dielectric spacers and the gate spacer 55 abut the top surface of the insulator layer 10.

Figure 3E:
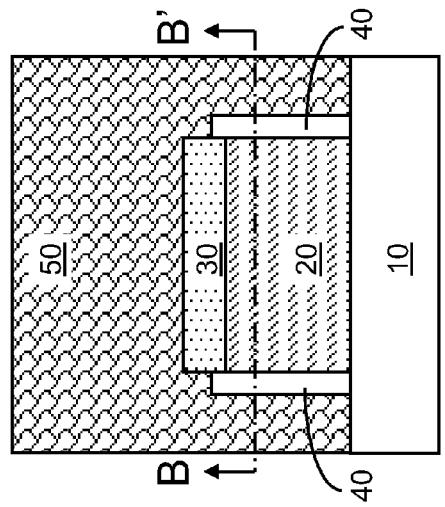
Figure 3D:
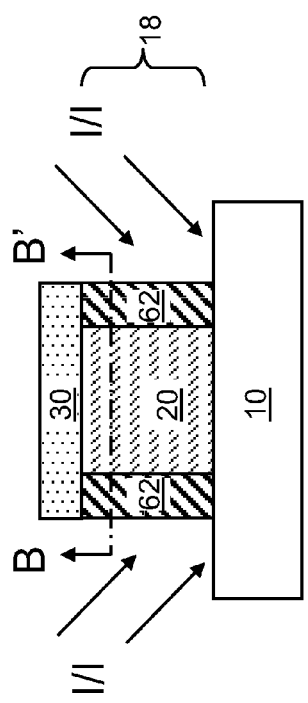
Figure 3F:
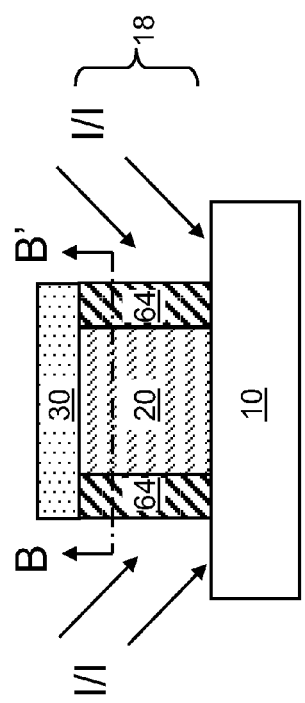

Referring to FIGS. 3A-3F, source and drain ion implantation is performed to implant dopants of a second conductivity type into the portion of the first sidewall in the first end, the portion of the second sidewall in the first end, the portion of the first sidewall in the second end, the portion of the second sidewall in the second end, and the second end wall of the semiconductor fin 18. The second conductivity type is the opposite of the first conductivity type. For example, if the first conductivity type is p-type, the second conductivity type is n-type, and vice versa. Angled ion implantation is employed to implant dopants of the second conductivity type through the first and second sidewalls and the second end wall of the semiconductor fin 18. The directions of angled ion implantation are shown schematically in FIGS. 3A and 3C. The gate conductor 50 and the dielectric fin cap portion 30 function as a masking structure for the ion implantation.

The implantation depth of the dopants of the second conductivity type is selected to be less than one half of the width of the semiconductor fin 18. The width of the semiconductor fin 18 is the distance between the first sidewall and the second sidewall of the semiconductor fin 18. First and second source regions 62 are formed directly beneath the portion of the first sidewall at the first end and directly beneath the portion of the second sidewall at the first end. The first and second source regions 62 are separated by a portion of the semiconductor fin 18 having a doping of the first conductivity type that is not implanted with dopants of the second conductivity type. Thus, the first source region does not abut the second source region. The portion of the semiconductor fin 18 having a doping of the first conductivity type is herein referred to as a body region 20, which functions as a body region of the HSSOI MOSFET in embodiments of the present invention. Each of the first and second source regions 62 may have an edge that substantially vertically coincides with an edge of the gate conductor 50. Further, each of the first and second source regions 62 may abut a peripheral portion of the first and second gate dielectrics 40, respectively. The overlay between the first and second source regions 62 and the first and second gate dielectrics 40 may be adjusted with the thickness of the gate spacer 55 and/or with the tilt angles of the angled ion implantation.

The drain region 64 extends from an edge of the first gate dielectric across the portion of the first sidewall on the second end to the second end wall, across the second end wall, across the second sidewall on the second end of the semiconductor fin 18, and to an edge of the second gate dielectric. The drain region 64 is of integral and unitary construction, i.e., connected together without a physically manifested interface and in a single contiguous piece. The drain region 64 includes a portion abutting the first sidewall, a second portion abutting the second end wall, and a third portion abutting the second sidewall. The interface between the drain region 64 and the body region 20 extends from the bottom surface of the dielectric fin cap portion 30 to a top surface of the insulator layer 10. The entirety of the interface between the drain region 64 and the body region 20 may be substantially vertical. The drain region 64 functions as the drain of the HSSOI MOSFET in embodiments of the present invention. The drain region 64 may have an edge that substantially vertically coincides with an edge of the gate conductor 50. Further, the drain region 64 may abut a peripheral portion of each of the first and second gate dielectrics 40. The overlay between the drain region 64 and the first and/or second gate dielectrics 40 may be adjusted by employing a gate spacer and/or by adjusting tilt angles of the angled ion implantation. The bottom surface of the dielectric fin cap portion 30 vertically abuts the drain region 64 and the body region 20.

Typically, the first and second source regions 62 and the drain region 64 are heavily doped to provide low resistance in each of the first and second source regions 62 and the drain region 64. For example, the dopant concentration of the first and second source regions 62 and the drain region 64 may range from $1.0\times10^{18}/cm^3$ to $1.0\times10^{22}/cm^3$, or possibly $1.0\times10^{19}/cm^3$ to $1.0\times10^{21}/cm^3$, although lesser and greater dopant concentrations for the first and second source regions 62 and the drain region 64 are also contemplated herein.

Figure 4B:
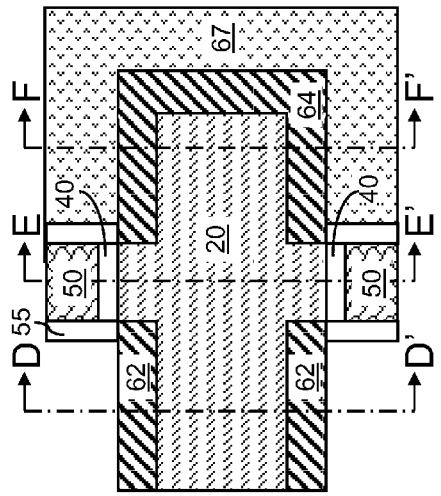
Figure 4A:
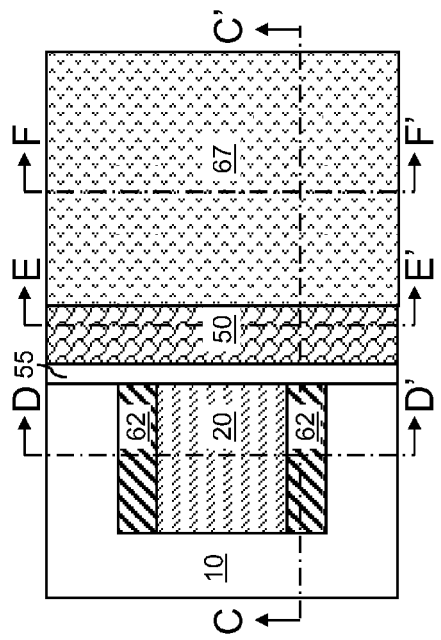
Figure 4C:
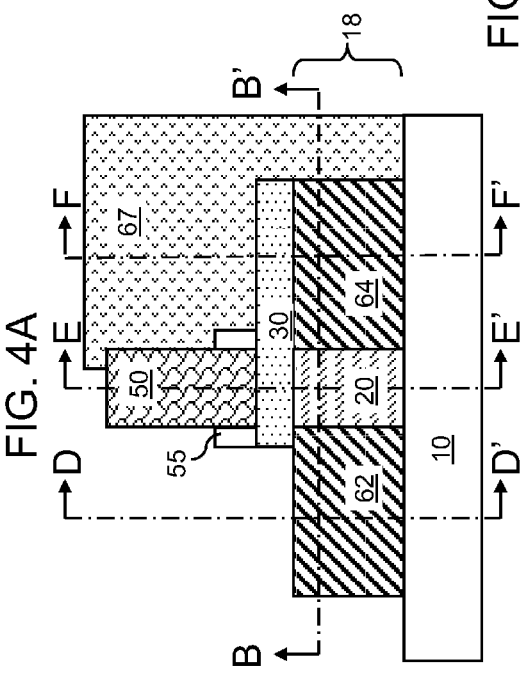

Referring to FIGS. 4A-4F, a photoresist 67 is applied over the semiconductor fin 18 and the dielectric fin cap portion 30 and is lithographically patterned to mask the second end of the semiconductor fin 18, while exposing the first end of the semiconductor fin 18. An edge of the photoresist 67 may overlie the gate conductor 50. Alternately, an edge of the photoresist may overlie the gate spacer 55 and completely cover the gate conductor 50. A sub-portion of the dielectric fin cap portion 30 located above the first end of the semiconductor fin 18 is exposed. An anisotropic etch is employed to remove the sub-portion of the dielectric fin cap portion 30 that is not covered by the gate conductor 50 or the photoresist 67. In the case where an edge of the photoresist 67 overlies the gate conductor 50, the gate conductor 50 and the photoresist 67 collectively function as an etch mask for the anisotropic etch. In the case where an edge of the photoresist 67 overlies the gate spacer 55 and completely covers the gate conductor 50, the photoresist 67 is employed as an etch mask for the anisotropic etch. An edge of the remaining portion of the dielectric fin cap portion 30 is substantially vertically coincident with the outer edge of the gate spacer 55 over the first end of the semiconductor fin 18.

Preferably, the anisotropic etch is selective to the semiconductor material of the semiconductor fin 18. The anisotropic etch may, or may not be selective to the insulator layer 10. Once the top surface of the first end of the semiconductor fin 18 is exposed, the photoresist 67 may be removed. However, embodiments in which the removal of the photoresist 67 is postponed until implantation of dopants of the first conductivity type or until implantation of ions of a recombination-center-generating element, are also contemplated herein.

Figure 5E:
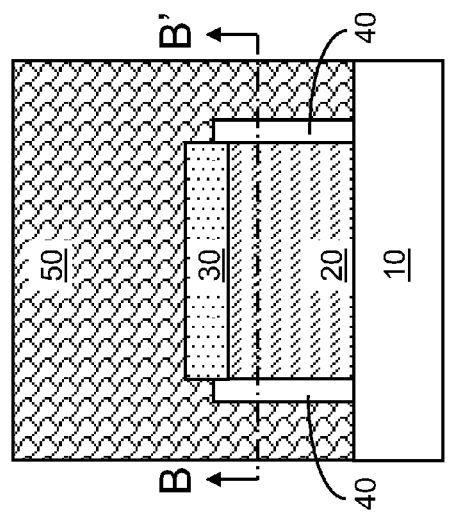
Figure 5D:
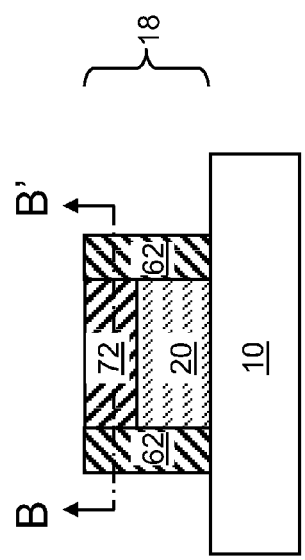
Figure 5F:
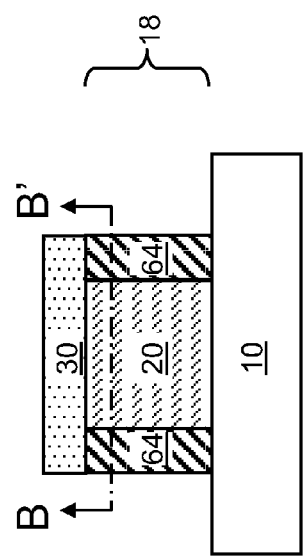

Referring to FIGS. 5A-5F, dopants of the first conductivity type may be implanted into the exposed top surface of the first end of the semiconductor fin 18. The top surface of the first end of the semiconductor fin 18 prior to the ion implantation includes top surfaces of the first and second source regions 62 and a top surface of the body region 20, which laterally abut the first and second source regions 62. The portion of the body region 20 which abuts the top surface of the first end of the semiconductor fin 18 and laterally abuts the first and second source regions 62 may be implanted with the dopants of the first conductivity type to form a first-conductivity-type doped region which is a modified semiconductor region 72. The thickness of the modified semiconductor region 72 in this case where the modified semiconductor region 72 is a first-conductivity-type doped region may range from 1 nm to 1000 nm, or possibly 10 nm to 100 nm, and typically from about 30 nm to about 60 nm, although lesser and greater thicknesses are also contemplated herein.

The dose of the ion implantation is set so that the implanted dopants of the first conductivity type do not change the type of doping of the top portions of the first and second source regions 62. In other words, the dopant concentration of dopants of the first conductivity type in the modified semiconductor region 72 is less than the dopant concentration of dopants of the second conductivity type in the first and second source regions 62. For example, the dopant concentration of the modified semiconductor region 72 may range from $1.0 \times 10^{15}/cm^3$ to $5.0 \times 10^{21}/cm^3$, or possibly $1.0 \times 10^{16}/cm^3$ to $5.0 \times 10^{20}/cm^3$, and typically from about $1.0 \times 10^{18}/cm^3$ to about $1.0 \times 10^{20}/cm^3$, although lesser and greater dopant concentrations for the modified semiconductor region 72 are also contemplated herein. Due to the additional dopants of the first conductivity type introduced into the modified semiconductor region 72, the modified semiconductor region 72 has a greater dopant concentration than the body region 20 in the semiconductor fin 18.

In one case, to form the modified semiconductor region 72 directly underneath the top surface of the first end of the semiconductor fin 18, the ion implantation of the dopants of the first conductivity type may be performed without any tilt angle, i.e., in a direction normal to the top surface of the semiconductor fin 18. The modified semiconductor region 72 extends from an edge of the dielectric fin cap portion 30 on the top surface of the semiconductor fin 18, across the top surface of the first end portion of the semiconductor fin 18 and to a horizontal line in the first end wall that is at the same level as the depth of the modified semiconductor region 72. In this case, the modified semiconductor region 72 does not abut the insulator layer 10, and the first end wall comprises an exposed substantially vertical surface of the body region 20.

The gate conductor 50, the gate spacer 55, and the dielectric fin cap portion 30 block the dopants of the first conductivity type during the implantation to prevent introduction of the dopants of the first conductivity type into the semiconductor fin 18. In the case where the photoresist 67 is present at this step, the photoresist may also be employed as an implantation mask. The photoresist 67, if present during the ion implantation, is removed subsequently.

In another case, the dopants of the first conductivity type may be implanted into the first end wall by angled ion implantation. The tilt angle of the ion implantation is set so that dopants of the first conductivity type are implanted through the first end wall, while implantation of dopants of the first conductivity type into the second end wall is prevented. In this case, the modified semiconductor region 72 extends from an edge of the dielectric fin cap portion 30 on the top surface of the semiconductor fin 18, across the top surface of the first end portion of the semiconductor fin 18, across the first end wall, and to the top surface of the insulator layer 10.

In yet another case, ions of a recombination-center-generating element may be implanted into the top surface of the first end of the semiconductor fin 18 to form the modified semiconductor region 72. The top surface of the first end of the semiconductor fin 18 prior to the ion implantation includes top surfaces of the first and second source regions 62 and a top surface of the body region 20, which laterally abut the first and second source regions 62. The portion of the body region 20 which abuts the top surface of the first end of the semiconductor fin 18 and laterally abuts the first and second source regions 62 may be implanted with the recombination-center-generating element to form a recombination-center-containing semiconductor region which is the modified semiconductor region 72.

Recombination-center-generating elements include, for example, nitrogen, oxygen, carbon, germanium, argon, krypton, xenon, gold, platinum, and a combination thereof. The recombination-center-generating element implanted into the modified semiconductor region 72 is not an electrical dopant belonging to group 3A or group 5A in the periodic table of the elements. Since the recombination-center-generating element is non-electrical, no additional free hole or free electron is added to the modified semiconductor region 72.

The thickness of the modified semiconductor region 72 may range from 1 nm to 1000 nm, or possibly 10 nm to 100 nm, and typically from about 30 nm to about 60 nm, although lesser and greater thicknesses are also contemplated herein. The thickness of the modified semiconductor region 72 is less than the thickness of the semiconductor fin 18. The concentration of the recombination-center-generating element may range from $1.0 \times 10^{11}/cm^3$ to $1.0 \times 10^{22}/cm^3$, or possibly $1.0 \times 10^{12}/cm^3$ to $1.0 \times 10^{21}/cm^3$, although lesser and greater concentrations are also contemplated herein. The dose of the recombination-center-generating element is determined to achieve the concentration range within the thickness of the modified semiconductor region 72.

The recombination-center-generating elements introduce damage to the crystalline structure such as point defects and dislocations into the modified semiconductor region 72. Due to the presence of the implanted recombination-center-generating elements, the modified semiconductor region 72 maintains a high density of crystalline defects even after activation anneals that activate electrical dopants in the first and second source region 62 and the drain region 64. The high defect density serves as a recombination center at which holes or electrons that accumulate in the body region 20 are collected and annihilated by recombination.

In one case, the modified semiconductor region 72 may have the same concentration of dopants of the first conductivity type as the body region 20. No additional electrical dopants, i.e., dopants that provide free electrons or free holes such as group 3A elements and group 5A elements, are added into the modified semiconductor region 72. The modified semiconductor region 72 does not include dopants of the second conductivity type.

In another case, dopants of the first conductivity type may be implanted into the modified semiconductor region 72 by ion implantation. The dose of the ion implantation is set so that the implanted dopants of the first conductivity type do not change the type of doping of the top portions of the first and second source regions 62. In other words, the dopant concentration of dopants of the first conductivity type in the modified semiconductor region 72 is less than the dopant concentration of dopants of the second conductivity type in the first and second source regions 62. For example, the concentration of dopants of the first conductivity type in the modified semiconductor region 72 may range from $1.0 \times 10^{15}/cm^3$ to $5.0 \times 10^{21}/cm^3$, or possibly $1.0 \times 10^{16}/cm^3$ to $5.0 \times 10^{20}/cm^3$, and typically from about $1.0 \times 10^{18}/cm^3$ to about $1.0 \times 10^{20}/cm^3$, although lesser and greater dopant concentrations for the modified semiconductor region 72 are also contemplated herein. Due to the additional dopants of the first conductivity type that are introduced into the modified semiconductor region 72, the modified semiconductor region 72 has a greater dopant concentration than the body region 20 in the semiconductor fin 18.

In one configuration, to form the modified semiconductor region 72 directly underneath the top surface of the first end of the semiconductor fin 18, the ion implantation of the recombination-center-generating element may be performed without any tilt angle, i.e., in a direction normal to the top surface of the semiconductor fin 18. The modified semiconductor region 72 extends from an edge of the dielectric fin cap portion 30 on the top surface of the semiconductor fin 18, across the top surface of the first end portion of the semiconductor fin 18 and to a horizontal line in the first end wall that is at the same level as the depth of the modified semiconductor region 72. In this case, the modified semiconductor region 72 does not abut the insulator layer 10, and the first end wall comprises an exposed substantially vertical surface of the body region 20.

The gate conductor 50, the gate spacer 55, and the dielectric fin cap portion 30 block the recombination-center-generating element during the implantation to prevent introduction of the ions of the recombination-center-generating element into the semiconductor fin 18. In the case where the photoresist 67 is present at this step, the photoresist may also be employed as an implantation mask. The photoresist 67, if present during the ion implantation, is removed subsequently.

In another configuration, the recombination-center-generating element may be implanted into the first end wall by angled ion implantation. The tilt angle of the ion implantation is set so that the ions of the recombination-center-generating element are implanted through the first end wall, while implantation of ions of the recombination-center-generating element into the second end wall is prevented. In this case, the modified semiconductor region 72 extends from an edge of the dielectric fin cap portion 30 on the top surface of the semiconductor fin 18, across the top surface of the first end portion of the semiconductor fin 18, across the first end wall, and to the top surface of the insulator layer 10.

Figure 6A:
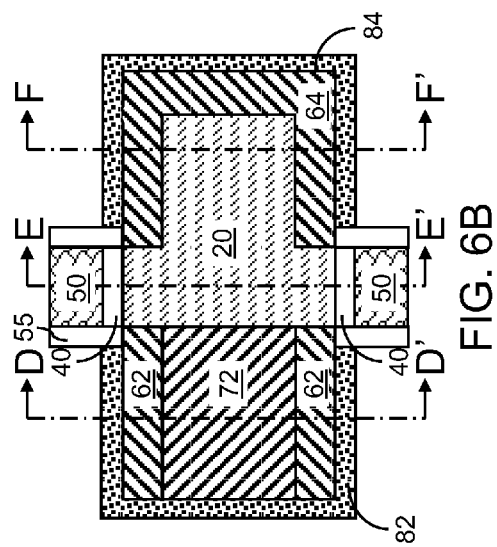
Figure 6B:
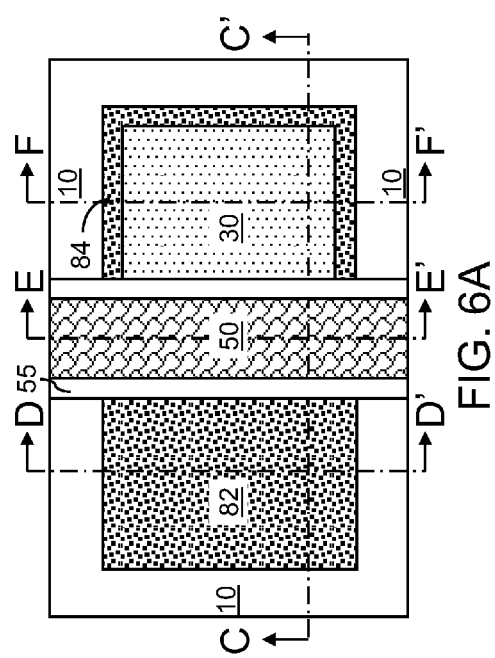
Figure 6C:
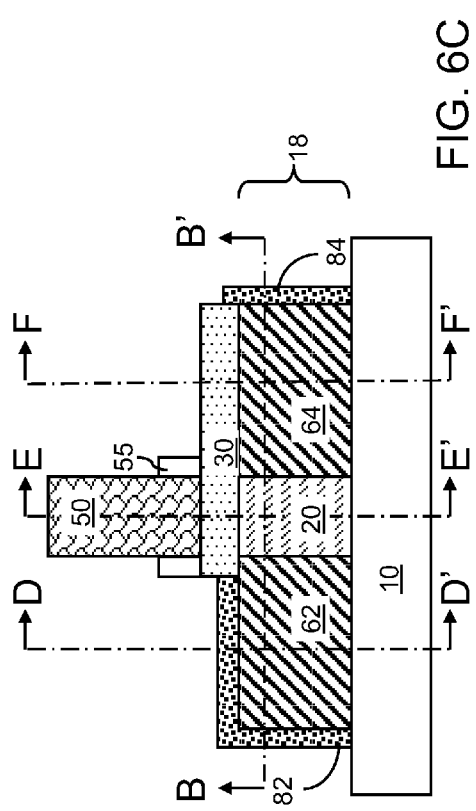
Figure 6E:
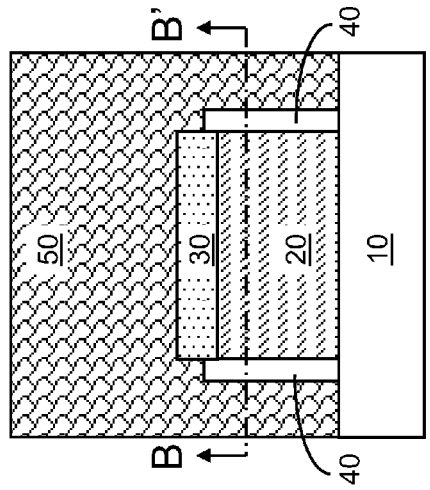
Figure 6D:
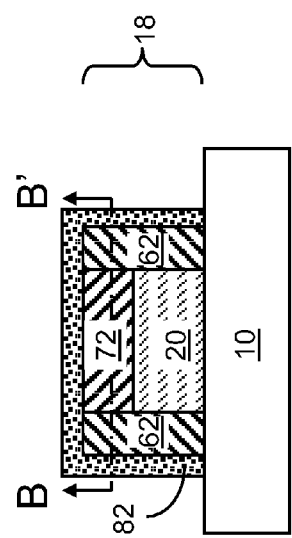
Figure 6F:
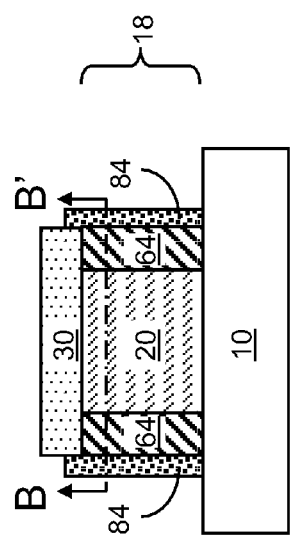

Referring to FIGS. 6A-6F, metal semiconductor alloy portions are formed on exposed semiconductor surfaces of the semiconductor fin 18. The metal semiconductor alloy portions may be formed, for example, by deposition of a metal layer on the exposed semiconductor surfaces and reaction of the metal layer with the semiconductor material underneath.

A source-side metal semiconductor alloy portion 82 is formed directly on the outside surfaces of the first and second source regions 62, the modified semiconductor region 72, and any exposed surface of the body region 20 on the first end wall, if present. Thus, source-side metal semiconductor alloy portion 82 abuts, and is electrically shorted to, the first and second source regions 62, the modified semiconductor region 72, and optionally, the body region 20 on the first end wall. The source-side metal semiconductor alloy portion 82 also abuts a sidewall surface of the dielectric fin cap portion 30. The source-side metal semiconductor alloy portion 82 may abut a top surface of the insulator layer 10 if residual dielectric spacers are not formed. The source-side metal semiconductor alloy portion 82 abuts residual dielectric spacers if residual dielectric spacers are present. The source-side metal semiconductor alloy portion 82 is of integral and unitary construction.

A drain-side metal semiconductor alloy portion 84 is formed directly on the outside surfaces of the drain region 64. The drain-side metal semiconductor alloy portion 84 abuts the drain region 64, and does not abut the body region 20. The drain-side metal semiconductor alloy portion 84 also abuts a sidewall surface of the dielectric fin cap portion 30. The drain-side metal semiconductor alloy portion 84 may abut a top surface of the insulator layer 10 if residual dielectric spacers are not formed. The drain-side metal semiconductor alloy portion 84 abuts residual dielectric spacers if residual dielectric spacers are present. The drain-side metal semiconductor alloy portion 84 is of integral and unitary construction.

The source-side metal semiconductor alloy portion 82 and the drain-side metal semiconductor alloy portion 84 comprise an alloy of the semiconductor material of the semiconductor fin 18 and the metal layer. In the case where the semiconductor fin 18 comprises silicon, the source-side metal semiconductor alloy portion 82 and the drain-side metal semiconductor alloy portion 84 comprise a metal silicide. In the case where the semiconductor fin 18 comprises a silicon-germanium alloy, the source-side metal semiconductor alloy portion 82 and the drain-side metal semiconductor alloy portion 84 may comprise a metal germano-silicide. If the gate conductor 50 comprises a semiconductor material, a gate-side metal semiconductor alloy portion (not shown) may be formed directly on the gate conductor 50.

Figure 7E:
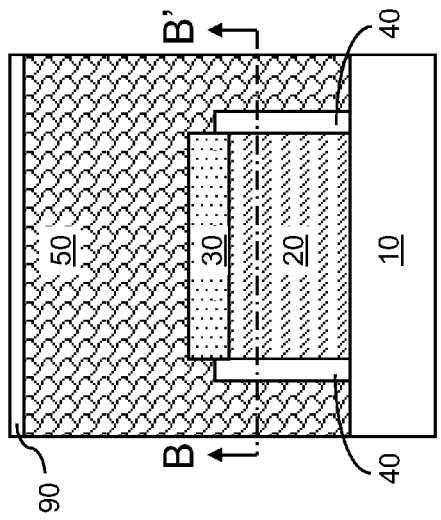
Figure 7D:
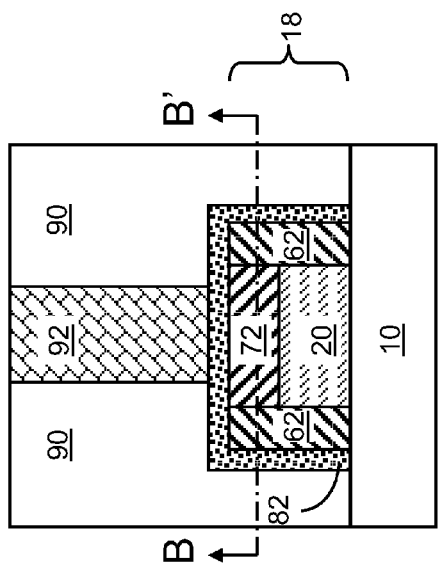
Figure 7F:
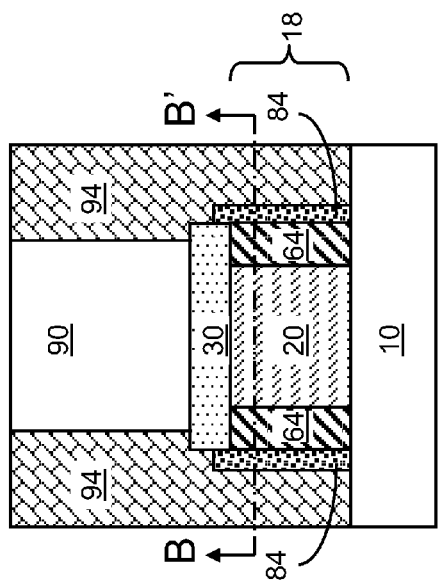

Referring to FIGS. 7A-7F, a middle-of-line (MOL) dielectric layer 90 is formed over the semiconductor fin 18 and directly on the source-side metal semiconductor alloy portion 82, the drain-side metal semiconductor alloy portion 84, the dielectric fin cap portion 30, the gate spacer 55, and at least one of the gate conductor 50 or a gate-side metal semiconductor alloy portion (not shown) formed directly on the gate conductor 50. The MOL dielectric layer 90 may comprise a silicon oxide, a silicon nitride, a chemical vapor deposition (CVD) low-k dielectric material, a spin-on low-k dielectric material, or a stack thereof. The MOL dielectric layer 90 may contain a mobile ion diffusion barrier layer that prevents diffusion of mobile ions such as sodium and potassium from back-end-of-line (BEOL) dielectric layers. Further, the MOL dielectric layer 90 may contain a stress liner that applies tensile or compressive stress on underlying structures to alter charge carrier mobility in the channels of the HSSOI MOSFET that are located directly beneath the first and second gate dielectrics 40.

Contact via holes are formed in the MOL dielectric layer 90 and filled with metal to form various metal contacts. For example, a source contact via 92 vertically abutting the source-side metal semiconductor alloy portion 82 and at least one drain-side contact via 94 laterally abutting the drain-side metal semiconductor alloy portion 84 may be formed. Since the drain-side metal semiconductor alloy portion 84 is not formed directly on the top surface of the semiconductor fin 18, the at least one drain-side contact via 94 laterally abuts the drain-side metal semiconductor alloy portion 84. This may be accomplished by forming at least one drain-side via hole that straddles the substantially vertical interface between the drain region 64 and the drain-side metal semiconductor alloy portion 84.

The HSSOI MOSFET may be oriented to take advantage of crystallographic orientations that may be selected from all possible orientations of the first and second sidewalls. Particularly, the surface orientation of the first and second sidewalls may be selected to maximize the charge carrier mobility for the HSSOI MOSFET in the channels, which are located directly beneath the first and second gate dielectrics 40. The body region 20 of the HSSOI MOSFET is electrically connected to the source-side metal semiconductor alloy portion 82 through the modified semiconductor region 72.

Figure 8D:
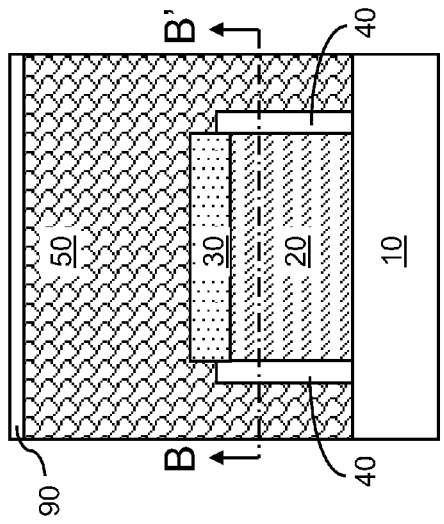
Figure 8E:
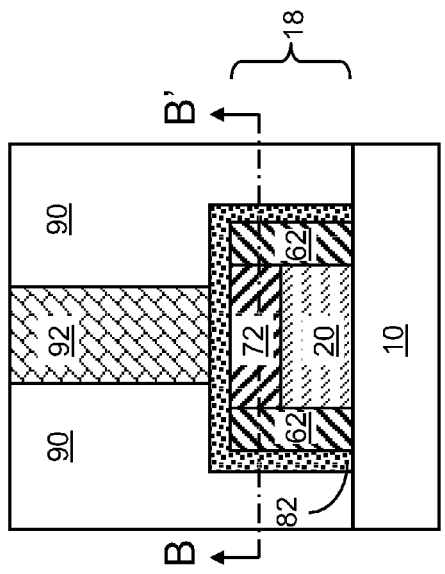
Figure 8F:
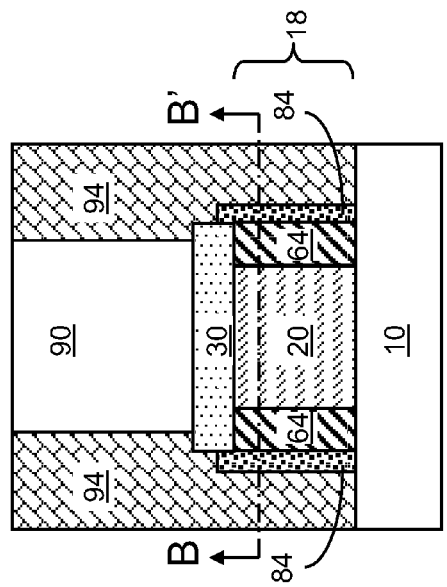

Referring to FIGS. 8A-8F, a variation of the first exemplary semiconductor structure may be derived from the first exemplary semiconductor structure by implanting dopants of the second conductivity type into the first end wall at the processing step corresponding to FIGS. 3A-3F. Angled ion implantation may be employed to implant dopants of the second conductivity type into the first end wall, thereby connecting the first and second source regions 62. An integrated source region 62' of integral and unitary construction is formed extending from an edge of the first gate dielectric across the portion of the first sidewall on the first end to the first end wall, across the first end wall, across the second sidewall on the first end of the semiconductor fin 18, and to an edge of the second gate dielectric. The integrated source region 62' includes the first and second source regions 62 of FIGS. 7A-7F.

Figure 9E:
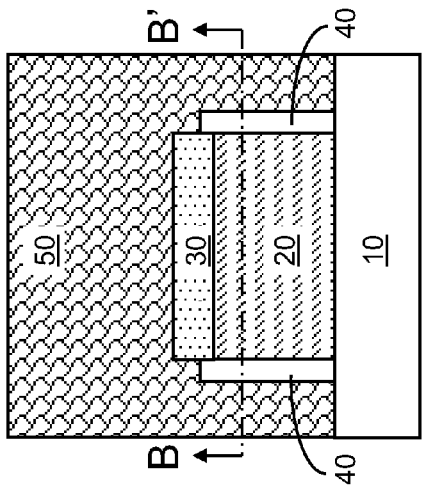
FIGS. 9A-13F are sequential views of a second exemplary hybrid surface semiconductor-on-insulator (HSSOI) metal-oxide-semiconductor field effect transistor (MOSFET) structure according to a second embodiment of the present invention.
Figure 9D:
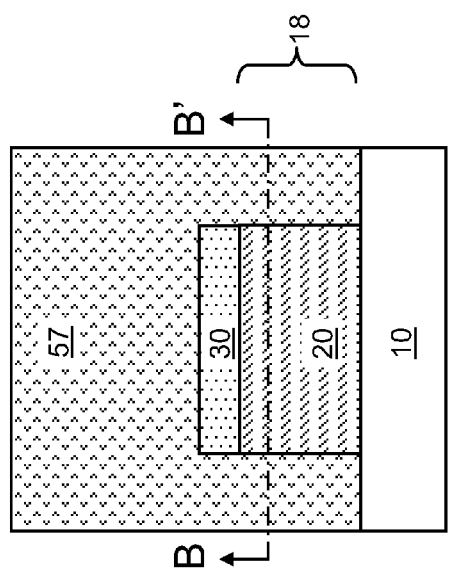
Figure 9F:
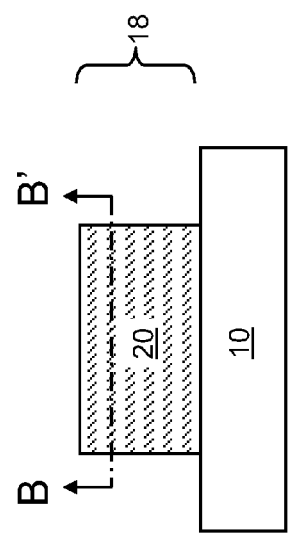

Referring to FIGS. 9A-9F, a second exemplary semiconductor structure according to a second embodiment of the present invention is derived from the first exemplary semiconductor structure of FIGS. 2A-2F. A photoresist 57 is applied over the semiconductor fin 18 and the dielectric fin cap portion 30 and is lithographically patterned to mask the first end of the semiconductor fin 18, while exposing the second end of the semiconductor fin 18. An edge of the photoresist 57 may overlie the gate conductor 50. Alternately, an edge of the photoresist may overlie the gate spacer 55 and completely cover the gate conductor 50. A sub-portion of the dielectric fin cap portion 30 located above the second end of the semiconductor fin 18 is exposed. An anisotropic etch is employed to remove the sub-portion of the dielectric fin cap portion 30 that is not covered by the gate conductor 50 or the photoresist 57. In the case where an edge of the photoresist 57 overlies the gate conductor 50, the gate conductor 50 and the photoresist 57 collectively function as an etch mask for the anisotropic etch. In the case where an edge of the photoresist 57 overlies the gate spacer 55 and completely covers the gate conductor 50, the photoresist 57 is employed as an etch mask for the anisotropic etch. An edge of the remaining portion of the dielectric fin cap portion 30 is substantially vertically coincident with the outer edge of the gate spacer 55 over the second end of the semiconductor fin 18.

Preferably, the anisotropic etch is selective to the semiconductor material of the semiconductor fin 18. The anisotropic etch may, or may not be selective to the insulator layer 10. Once the top surface of the second end of the semiconductor fin 18 is exposed, the photoresist 57 may be removed.

Figure 10E:
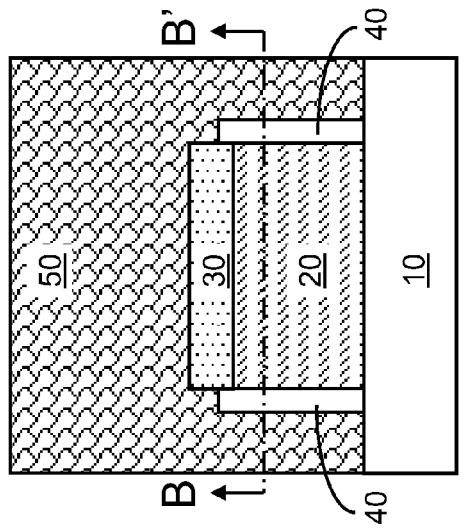
Figure 10D:
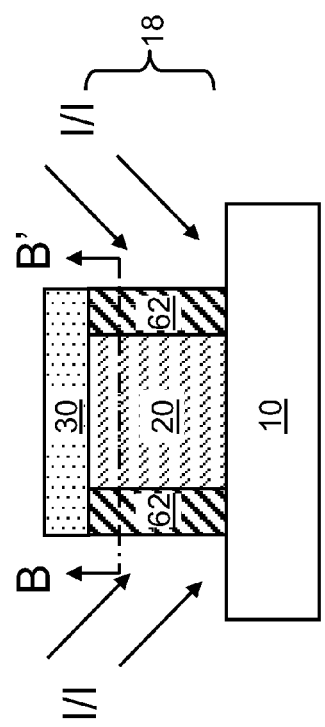
Figure 10F:
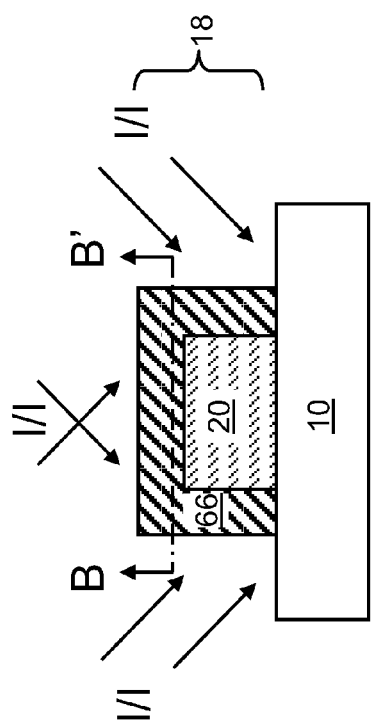

Referring to FIGS. 10A-10F, source and drain ion implantation is performed to implant dopants of the second conductivity type into the portion of the first sidewall in the first end, the portion of the second sidewall in the first end, the portion of the first sidewall in the second end, the portion of the second sidewall in the second end, and the second end wall of the semiconductor fin 18. As discussed above, the second conductivity type is the opposite of the first conductivity type. Angled ion implantation is employed to implant dopants of the second conductivity type through the first and second sidewalls and the second end wall of the semiconductor fin 18. The directions of angled ion implantation are shown schematically in FIGS. 10A and 10C. The gate conductor 50 and the dielectric fin cap portion 30 function as a masking structure for the ion implantation.

The implantation depth of the dopants of the second conductivity type is selected to be less than one half of the width of the semiconductor fin 18, and, more typically, to a location slightly away from the fin sidewalls. First and second source regions 62 are formed directly beneath the portion of the first sidewall at the first end and directly beneath the portion of the second sidewall at the first end in the same manner as in the first embodiment.

The drain region 66 extends from an edge of the first gate dielectric across the portion of the first sidewall on the second end to the second end wall, across the second end wall, across the second sidewall on the second end of the semiconductor fin 18, and to an edge of the second gate dielectric in the lateral direction. The drain region also extends from the first sidewall on the second end, up to the top surface of the second end of the semiconductor fin 18, across the top surface of the second end of the semiconductor fin 18, and to the second sidewall on the second end of the semiconductor fin 18. Thus, all exposed surfaces of the second end of the semiconductor fin are surfaces of the drain region 66. The drain region 66 is of integral and unitary construction, i.e., connected together without a physically manifested interface and in a single contiguous piece.

The drain region 66 includes a portion abutting the first sidewall, a second portion abutting the second end wall, a third portion abutting the second sidewall, and a fourth portion abutting the top surface of the second end of the semiconductor fin 18. The interface between the drain region 66 and the body region 20 includes a substantially horizontal surface between the fourth portion of the drain region 66 and the body region 20 and substantially vertical surfaces between the first, second, and third portions of the drain region 20 and the body region 20. Thus, a portion of the body region 20 underlies the drain region 66. The drain region 66 functions as the drain of the HSSOI MOSFET in embodiments of the present invention. The drain region 66 may have an edge that substantially vertically coincides with an edge of the gate conductor 50. Further, the drain region 66 may abut a peripheral portion of each of the first and second gate dielectric 40. The overlay between the drain region 66 and the first and/or second gate dielectrics 40 may be adjusted with the thickness of the gate spacer 55 and/or with the tilt angles of the angled ion implantation. The bottom surface of the dielectric fin cap portion 30 vertically abuts the drain region 66 and the body region 20.

Typically, the first and second source regions 62 and the drain region 66 are heavily doped to provide low resistance in each of the first and second source regions 62 and the drain region 66. For example, the dopant concentration of the first and second source regions 62 and the drain region 66 may range from $1.0 \times 10^{18}/cm^3$ to $1.0 \times 10^{22}/cm^3$, or possibly $1.0 \times 10^{19}/cm^3$ to $1.0 \times 10^{21}/cm^3$, although lesser and greater dopant concentrations for the first and second source regions 62 and the drain region 66 are also contemplated herein.

Figure 11B:
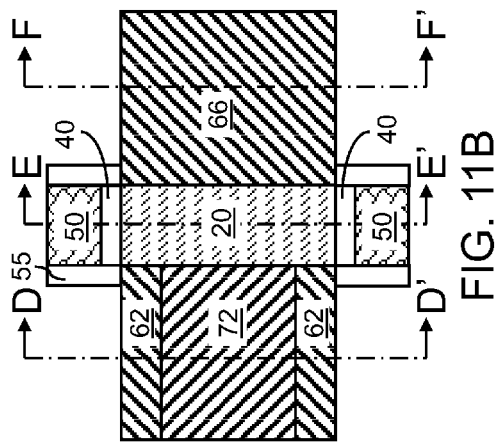
Figure 11A:
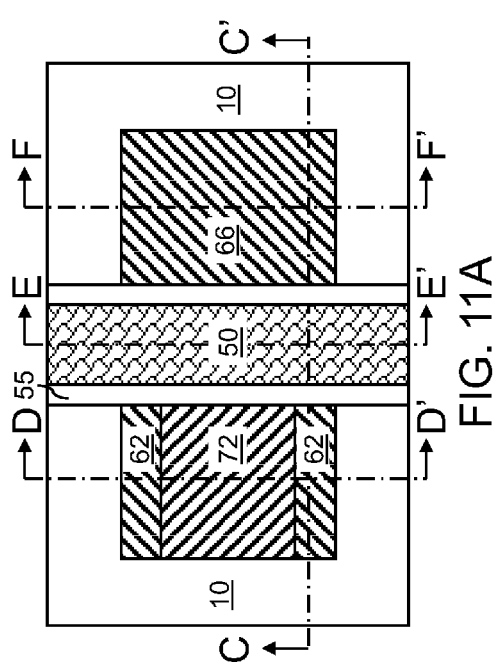
Figure 11C:
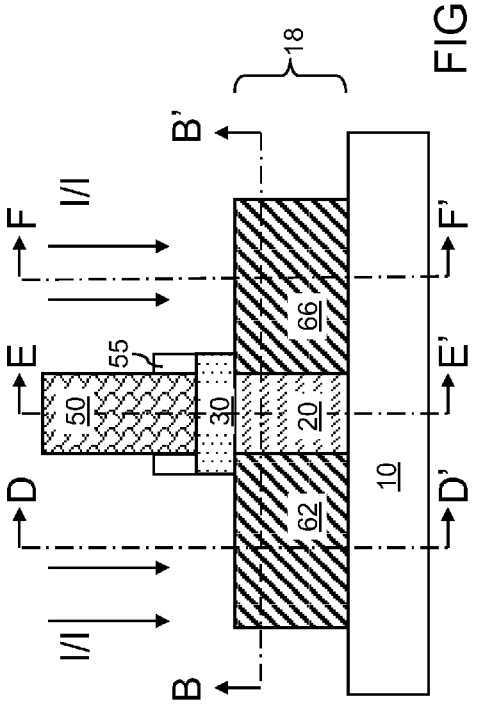

Referring to FIGS. 11A-11F, the exposed sub-portion of the dielectric fin cap portion 30 over the first end of the semiconductor fin 18 and not covered by the gate conductor 50 or the gate spacer 55 is removed by an etch, which may be an anisotropic ion etch or an isotropic etch. The gate conductor 50 and the gate spacer 55 are collectively employed as an etch mask. Preferably, the etch is selective to the material of the semiconductor fin 18. Not necessarily but preferably, the etch is selective to the material of the insulator layer 10. The top surface of the first end of the semiconductor fin 18 is exposed after the etch.

Dopants of the first conductivity type are implanted into the exposed top surfaces of the first end and the second end of the semiconductor fin 18. The top surface of the first end of the semiconductor fin 18 prior to the ion implantation includes top surfaces of the first and second source regions 62 and a top surface of the body region 20, which laterally abut the first and second source regions 62. The top surface of the second end of the semiconductor fin 18 prior to the ion implantation is a top surface of the drain region 66.

The portion of the body region 20 which abuts the top surface of the first end of the semiconductor fin 18 and laterally abuts the first and second source regions 62 is implanted with the dopants of the first conductivity type to form a modified semiconductor region 72. The thickness of the modified semiconductor region 72 may range from 1 nm to 1000 nm, or possibly 10 nm to 100 nm, and typically from about 30 nm to about 60 nm, although lesser and greater thicknesses are also contemplated herein.

The dose of the ion implantation is set so that the implanted dopants of the first conductivity type do not change the type of doping of the top portions of the first and second source regions 62. Likewise, the implanted dopants of the first conductivity type do not change the type of doping of the implanted top portion of the drain region 66. The dopant concentration of dopants of the first conductivity type in the modified semiconductor region 72 is less than the dopant concentration of dopants of the second conductivity type in the first and second source regions 62 and in the drain region 66. For example, the dopant concentration of the modified semiconductor region 72 may range from $1.0 \times 10^{15}/cm^3$ to $5.0 \times 10^{21}/cm^3$, or possibly $1.0 \times 10^{16}/cm^3$ to $5.0 \times 10^{20}/cm^3$, and typically from about $1.0 \times 10^{18}/cm^3$ to about $1.0 \times 10^{20}/cm^3$, although lesser and greater dopant concentrations for the modified semiconductor region 72 are also contemplated herein. Due to the additional dopants of the first conductivity type introduced into the modified semiconductor region 72, the modified semiconductor region 72 has a greater dopant concentration than the body region 20 in the semiconductor fin 18.

In one case, to form the modified semiconductor region 72 directly underneath the top surface of the first end of the semiconductor fin 18, the ion implantation of the dopants of the first conductivity type may be performed without any tilt angle, i.e., in a direction normal to the top surface of the semiconductor fin 18. The modified semiconductor region 72 extends from an edge of the dielectric fin cap portion 30 on the top surface of the semiconductor fin 18, across the top surface of the first end portion of the semiconductor fin 18 and to a horizontal line in the first end wall that is at the same level as the depth of the modified semiconductor region 72. In this case, the modified semiconductor region 72 does not abut the insulator layer 10, and the first end wall comprises an exposed substantially vertical surface of the body region 20.

The gate conductor 50, the gate spacer 55, and the dielectric fin cap portion 30 block the dopants of the first conductivity type during the implantation to prevent introduction of the dopants of the first conductivity type into the semiconductor fin 18.

In another case, the dopants of the first conductivity type may be implanted into the first end wall by angled ion implantation. The tilt angle of the ion implantation is set so that dopants of the first conductivity type are implanted through the first end wall, while implantation of dopants of the first conductivity type into the second end wall is prevented. In this case, the modified semiconductor region 72 extends from an edge of the dielectric fin cap portion 30 on the top surface of the semiconductor fin 18, across the top surface of the first end portion of the semiconductor fin 18, across the first end wall, and to the top surface of the insulator layer 10.

In yet another case, ions of the recombination-center-generating element may be implanted into the exposed top surfaces of the first end and the second end of the semiconductor fin 18 in the same manner as in the first embodiment. The top surface of the first end of the semiconductor fin 18 prior to the ion implantation includes top surfaces of the first and second source regions 62 and a top surface of the body region 20, which laterally abut the first and second source regions 62. The top surface of the second end of the semiconductor fin 18 prior to the ion implantation is a top surface of the drain region 66.

The portion of the body region 20 which abuts the top surface of the first end of the semiconductor fin 18 and laterally abuts the first and second source regions 62 may be implanted with the ions of the recombination-center-generating element to form a modified semiconductor region 72. The thickness of the modified semiconductor region 72 may range from 1 nm to 1000 nm, or possibly 10 nm to 100 nm, and typically from about 30 nm to about 60 nm, although lesser and greater thicknesses are also contemplated herein. The atomic concentration of the recombination-center-generating element may be the same as in the first embodiment.

The modified semiconductor region 72 may have the same atomic concentration of dopants of the first conductivity as the body region 20, or may have a higher atomic concentration of dopants of the first conductivity type than the body region 20. In the case where any additional dopants of the first conductivity are introduced into the modified semiconductor region 72, the same methods may be employed as in the first embodiment.

In one case, to form the modified semiconductor region 72 directly underneath the top surface of the first end of the semiconductor fin 18, the ion implantation of the recombination-center-generating element may be performed without any tilt angle, i.e., in a direction normal to the top surface of the semiconductor fin 18. The modified semiconductor region 72 extends from an edge of the dielectric fin cap portion 30 on the top surface of the semiconductor fin 18, across the top surface of the first end portion of the semiconductor fin 18 and to a horizontal line in the first end wall that is at the same level as the depth of the modified semiconductor region 72. In this case, the modified semiconductor region 72 does not abut the insulator layer 10, and the first end wall comprises an exposed substantially vertical surface of the body region 20.

The gate conductor 50, the gate spacer 55, and the dielectric fin cap portion 30 block the ions of the recombinationcenter-generating element during the implantation to prevent introduction of the recombination-center-generating element into the semiconductor fin 18.

In another case, the ions of the recombination-center-generating element may be implanted into the first end wall by angled ion implantation. The tilt angle of the ion implantation is set so that ions of the recombination-center-generating element are implanted through the first end wall, while implantation of ions of the recombination-center-generating element into the second end wall may be prevented. In this case, the modified semiconductor region 72 extends from an edge of the dielectric fin cap portion 30 on the top surface of the semiconductor fin 18, across the top surface of the first end portion of the semiconductor fin 18, across the first end wall, and to the top surface of the insulator layer 10.

Figure 12B:
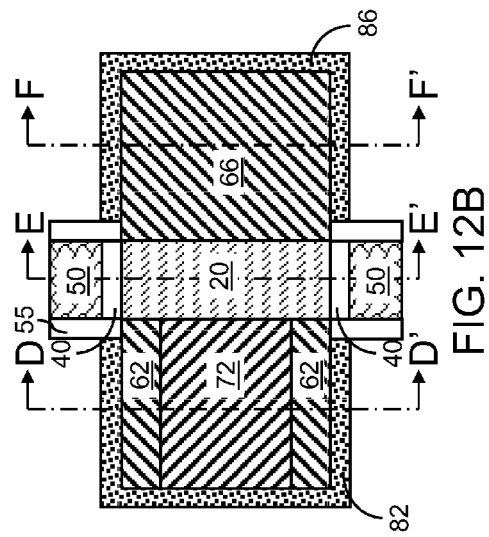
Figure 12A:
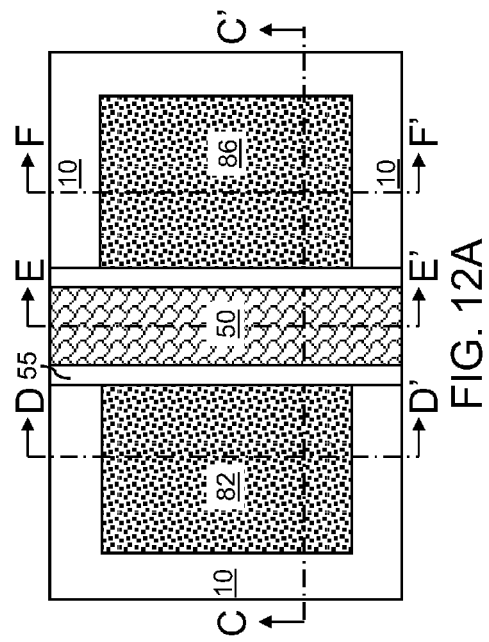
Figure 12C:
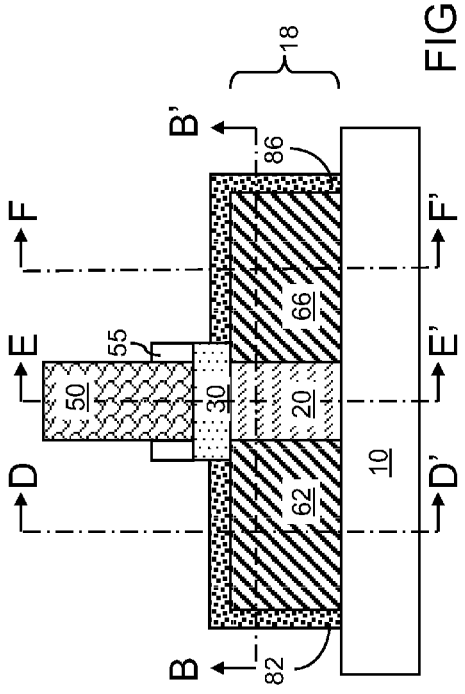
Figure 12E:
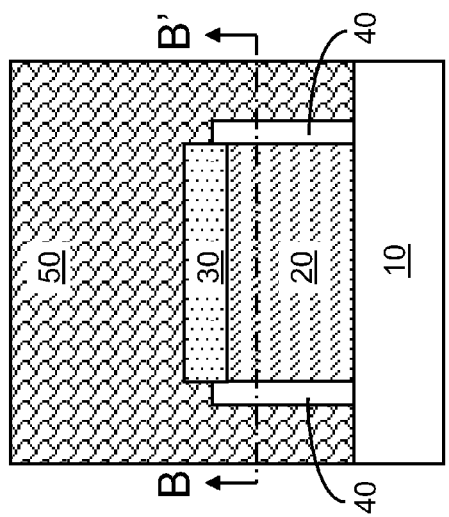
Figure 12D:
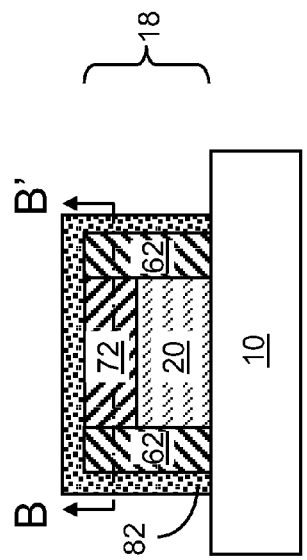
Figure 12F:
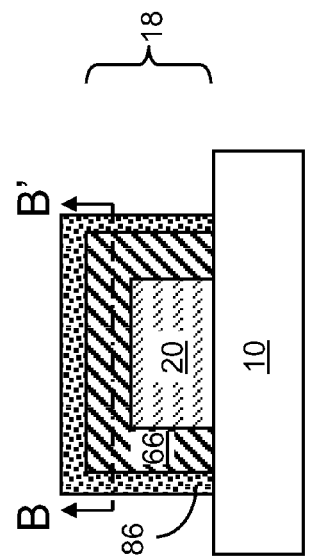

Referring to FIGS. 12A-12F, metal semiconductor alloy portions are formed on exposed semiconductor surfaces of the semiconductor fin 18 in the same manner as in the first embodiment. A source-side metal semiconductor alloy portion 82 is formed directly on the outside surfaces of the first and second source regions 62, the modified semiconductor region 72, and any exposed surface of the body region 20 on the first end wall, if present. The source-side metal semiconductor alloy portion 82 may abut a top surface of the insulator layer 10 if residual dielectric spacers are not formed. The source-side metal semiconductor alloy portion 82 abuts residual dielectric spacers if residual dielectric spacers are present. The source-side metal semiconductor alloy portion 82 is of integral and unitary construction.

A drain-side metal semiconductor alloy portion 86 is formed directly on the outside surfaces of the drain region 66. Specifically, the drain-side metal semiconductor alloy portion is formed directly on the second end of the first sidewall, the second end of the second sidewall, the second end wall, and the top surface of the second end of the semiconductor fin 18. Thus, a sub-portion of the drain-side metal semiconductor alloy portion 86 overlies the drain region 66 and a portion of the body region 20. The drain-side metal semiconductor alloy portion 86 abuts the drain region 66, and does not abut the body region 20. The drain-side metal semiconductor alloy portion 86 also abuts a sidewall surface of the dielectric fin cap portion 30, in which the sidewall surface is substantially vertically coincident with an edge of the gate spacer 55. The drain-side metal semiconductor alloy portion 86 may abut a top surface of the insulator layer 10 if residual dielectric spacers are not formed. The drain-side metal semiconductor alloy portion 86 abuts residual dielectric spacers if residual dielectric spacers are present. The drain-side metal semiconductor alloy portion 86 is of integral and unitary construction.

The source-side metal semiconductor alloy portion 82 and the drain-side metal semiconductor alloy portion 86 comprise an alloy of the semiconductor material of the semiconductor fin 18 and the metal layer as in the first embodiment.

Figure 13A:
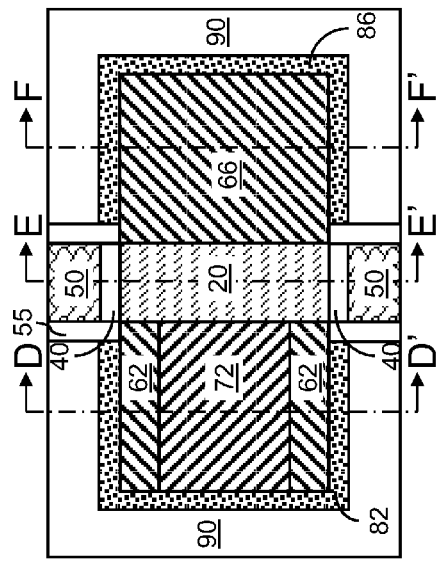
Figure 13B:
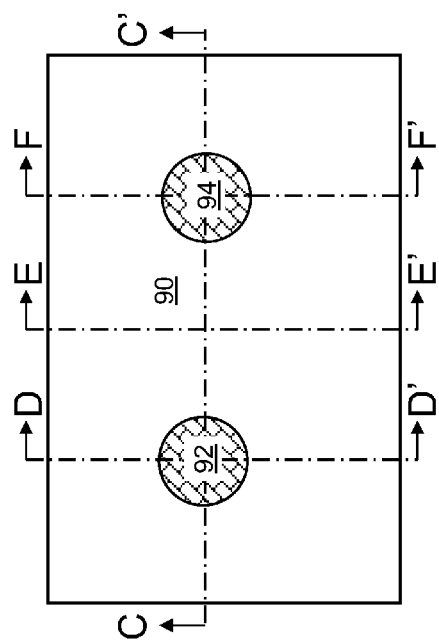
Figure 13C:
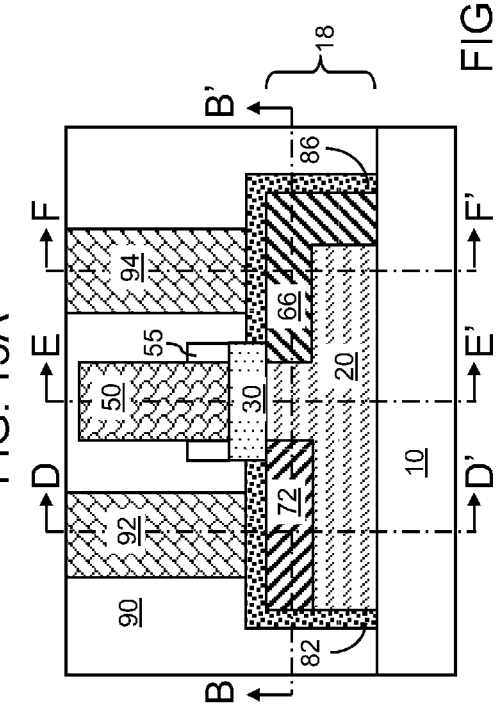
Figure 13E:
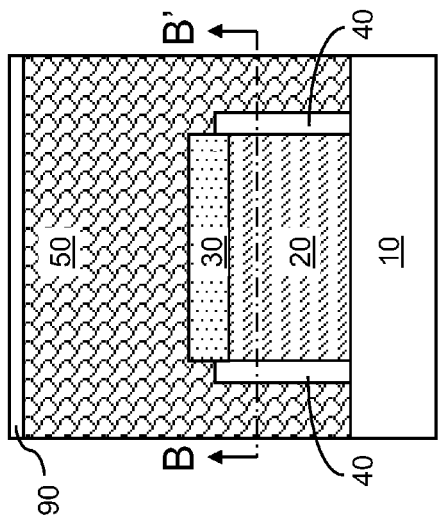
Figure 13D:
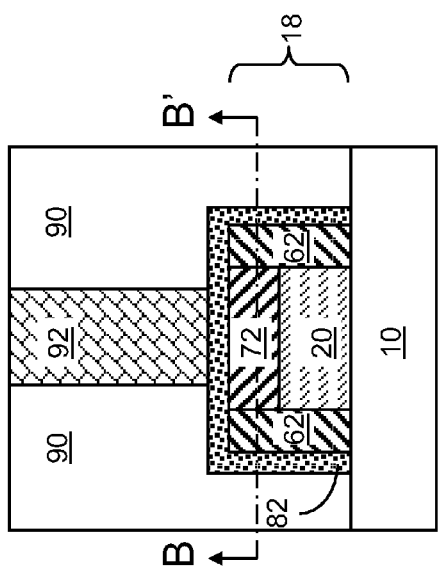
Figure 13F:
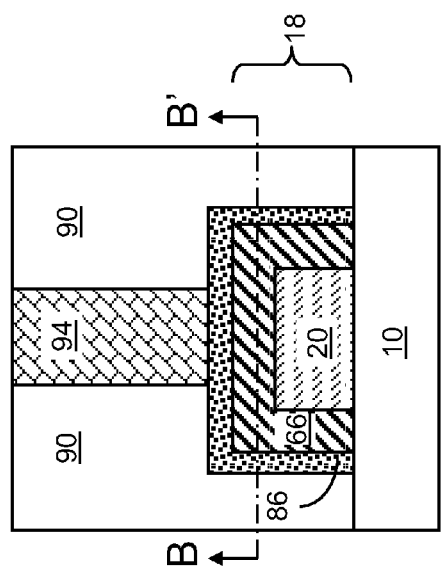

Referring to FIGS. 13A-13F, a middle-of-line (MOL) dielectric layer 90 is formed over the semiconductor fin 18 as in the first embodiment. Contact via holes are formed in the MOL dielectric layer 90 and filled with metal to form various metal contacts. For example, a source contact via 92 vertically abutting the source-side metal semiconductor alloy portion 82 and a drain-side contact via 94 vertically abutting the drain-side metal semiconductor alloy portion 86 may be formed. Since the drain-side metal semiconductor alloy portion 86 is formed directly on the top surface of the semiconductor fin 18, the drain-side contact via vertically abuts the drain-side metal semiconductor alloy portion 86.

The HSSOI MOSFET may be oriented to take advantage of crystallographic orientations that may be selected from all possible orientations of the first and second sidewalls as in the first embodiment. The body region 20 of the HSSOI MOSFET is electrically connected to the source-side metal semiconductor alloy portion 82 through the modified semiconductor region 72.

Figure 14E:
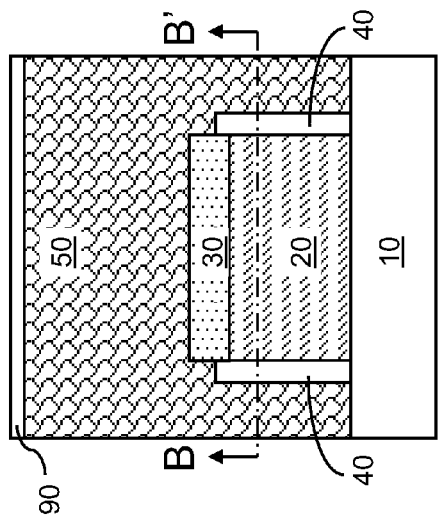
Figure 14D:
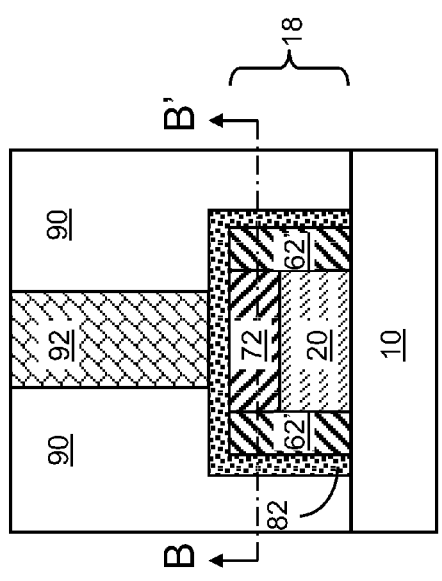
Figure 14F:
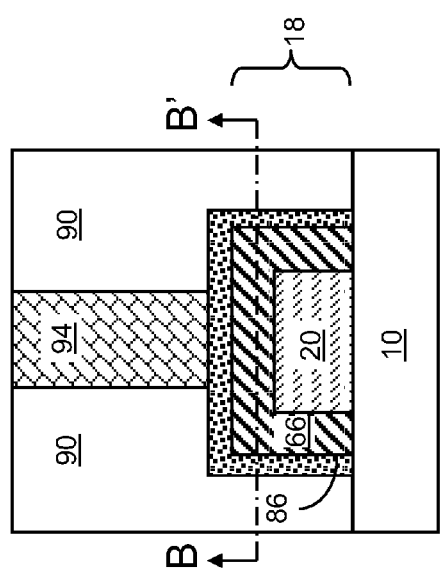

Referring to FIGS. 14A-14F, a variation of the second exemplary semiconductor structure may be derived from the second exemplary semiconductor structure by implanting dopants of the second conductivity type into the first end wall at the processing step corresponding to FIGS. 11A-11F. Angled ion implantation may be employed to implant dopants of the second conductivity type into the first end wall, thereby connecting the first and second source regions 62. An integrated source region 62' of integral and unitary construction is formed extending from an edge of the first gate dielectric across the portion of the first sidewall on the first end to the first end wall, across the first end wall, across the second sidewall on the first end of the semiconductor fin 18, and to an edge of the second gate dielectric. The integrated source region 62' includes the first and second source regions 62 of FIGS. 13A-13F.

Figure 15E:
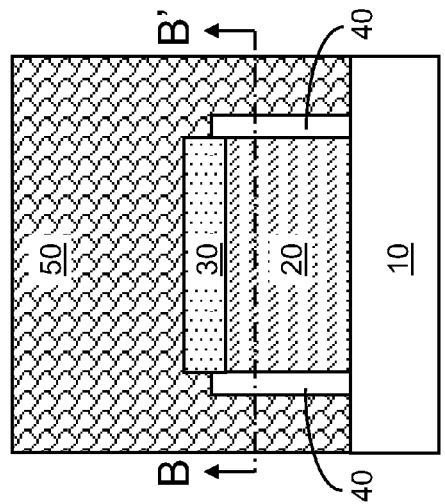
FIGS. 15A-16F are sequential views of a third exemplary hybrid surface semiconductor-on-insulator (HSSOI) metal-oxide-semiconductor field effect transistor (MOSFET) structure according to a third embodiment of the present invention.
Figure 15D:
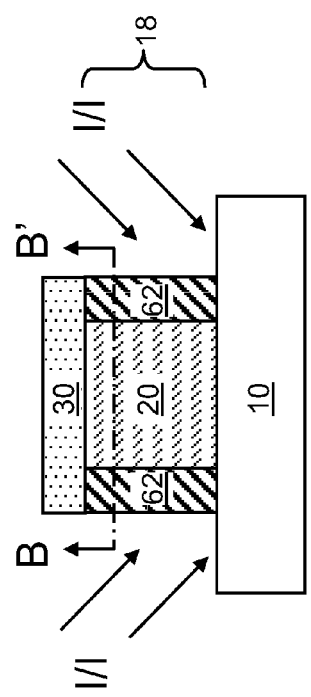
Figure 15F:
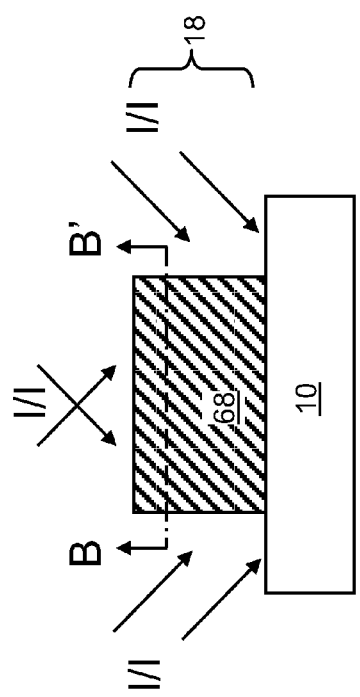

Referring to FIGS. 15A-15F, a third exemplary semiconductor structure according to a third embodiment of the present invention is derived from the second exemplary semiconductor structure of FIGS. 10A-10F. Angled ion implantation is employed to implant dopants of the second conductivity type through the first and second sidewalls and the second end wall of the semiconductor fin 18 as in the second embodiment. During the source and drain ion implantation, however, the energy and dose of dopants of the second conductivity type that are implanted into the second end of the semiconductor fin 18 are adjusted so that the entirety of the second end of the semiconductor fin 18 has a doping of the second conductivity type. In other words, the entirety of the second end of the semiconductor fin 18 becomes a drain region 68. The drain region 68 is of integral and unitary construction, i.e., connected together without a physically manifested interface and in a single contiguous piece.

The entirety of the interface between the drain region 68 and the body region 20 is substantially vertical. The interface between the drain region 68 and the body region 20 extends from a bottom surface of the dielectric fin cap portion 30 to a top surface of the insulator layer 10. The drain region 68 does not overlie the body region 20, and vertically abuts the insulator layer 10. The directions of angled ion implantation are shown schematically in FIGS. 15A and 15C. The gate conductor 50 and the dielectric fin cap portion 30 function as a masking structure for the ion implantation. The first and second source regions 62 of the third embodiment may be identical to the first and second source regions 62 of the second embodiment.

The drain region 68 functions as the drain of the HSSOI MOSFET in embodiments of the present invention. The drain region 68 may have an edge that substantially vertically coincides with an edge of the gate conductor 50. Further, the drain region 68 may abut a peripheral portion of each of the first and second gate dielectric 40. The overlay between the drain region 68 and the first and/or second gate dielectrics 40 may be adjusted with the thickness of the gate spacer 55 and/or with the tilt angles of the angled ion implantation. The bottom surface of the dielectric fin cap portion 30 vertically abuts the drain region 68 and the body region 20.

Typically, the first and second source regions 62 and the drain region 68 are heavily doped to provide low resistance in each of the first and second source regions 62 and the drain region 68. For example, the dopant concentration of the first and second source regions 62 and the drain region 68 may range from $1.0 \times 10^{18}/cm^3$ to $1.0 \times 10^{22}/cm^3$, or possibly $1.0 \times 10^{19}/cm^3$ to $1.0 \times 10^{21}/cm^3$, although lesser and greater dopant concentrations for the first and second source regions 62 and the drain region 68 are also contemplated herein.

Figure 16E:
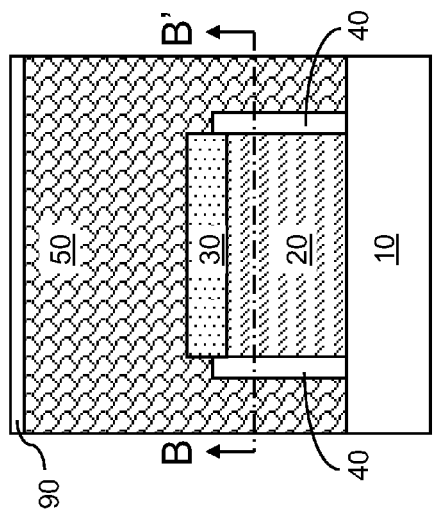
Figure 16D:
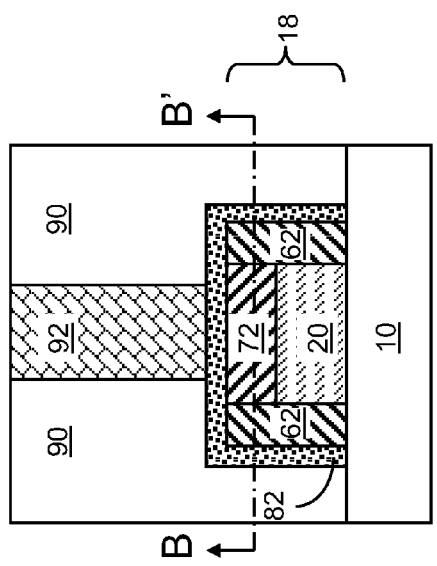
Figure 16F:
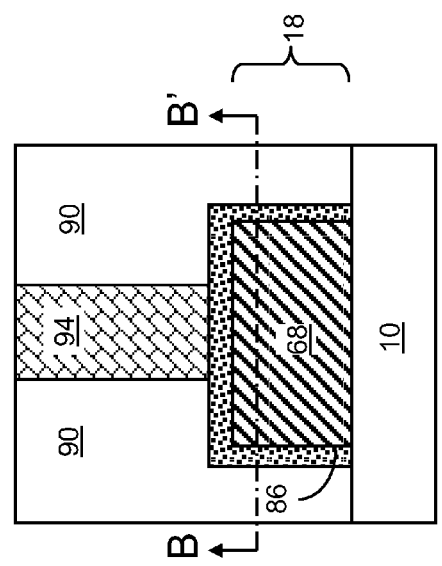

Referring to FIGS. 16A-16F, processing steps corresponding to FIGS. 11A-13F are performed as in the second embodiment. As in the first and second embodiments, the HSSOI MOSFET may be oriented to take advantage of crystallographic orientations that may be selected from all possible orientations of the first and second sidewalls. The body region 20 of the HSSOI MOSFET is electrically connected to the source-side metal semiconductor alloy portion 82 through the modified semiconductor region 72.

Figure 17A:
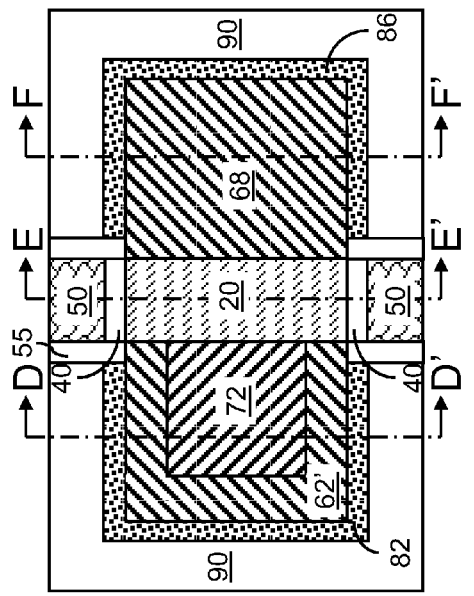
FIGS. 17A-17F are various views of a variation of the third exemplary HSSOI MOSFET structure according to the third embodiment of the present invention.
Figure 17B:
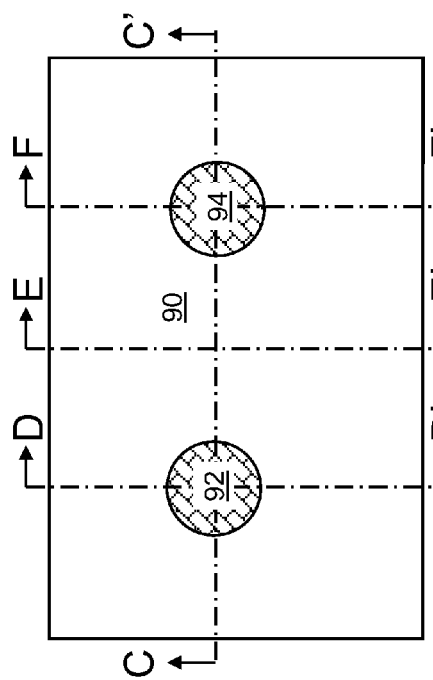
Figure 17C:
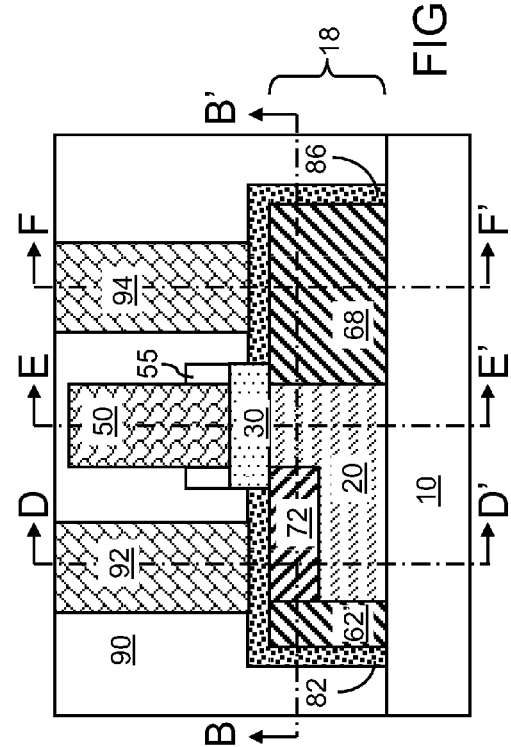
Figure 17E:
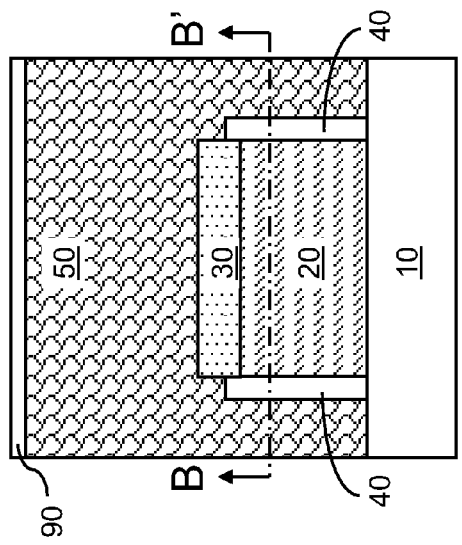
Figure 17D:
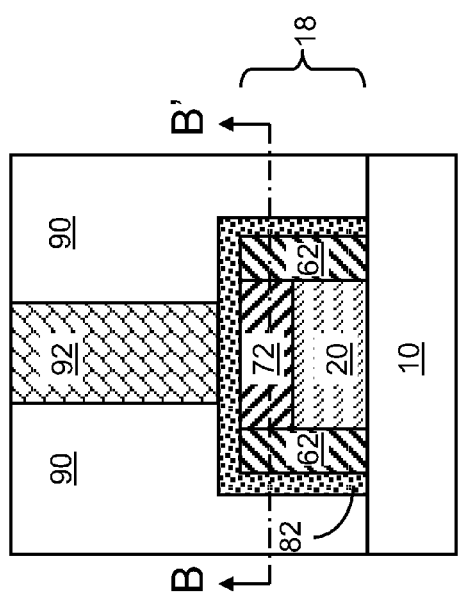
Figure 17F:
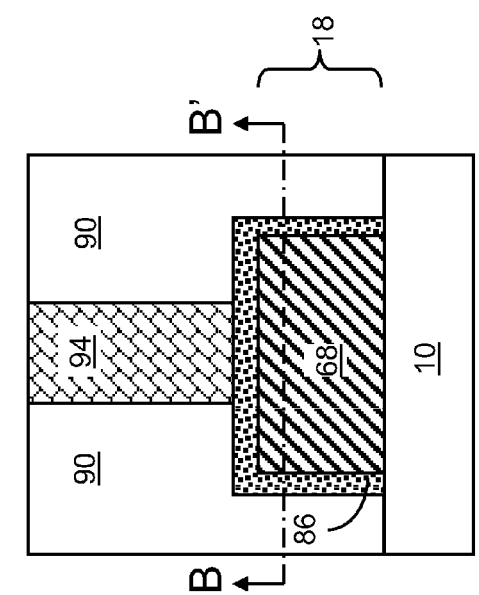

Referring to FIGS. 17A-17F, a variation of the third exemplary semiconductor structure may be derived from the third exemplary semiconductor structure by implanting dopants of the second conductivity type into the first end wall at the processing step corresponding to FIGS. 11A-11F. Angled ion implantation may be employed to implant dopants of the second conductivity type into the first end wall, thereby connecting the first and second source regions 62. An integrated source region 62' of integral and unitary construction is formed extending from an edge of the first gate dielectric across the portion of the first sidewall on the first end to the first end wall, across the first end wall, across the second sidewall on the first end of the semiconductor fin 18, and to an edge of the second gate dielectric. The integrated source region 62' includes the first and second source regions 62 of FIGS. 16A-16F.

Figure 18E:
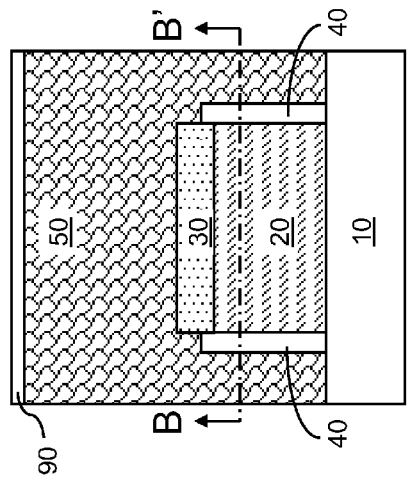
Figure 18D:
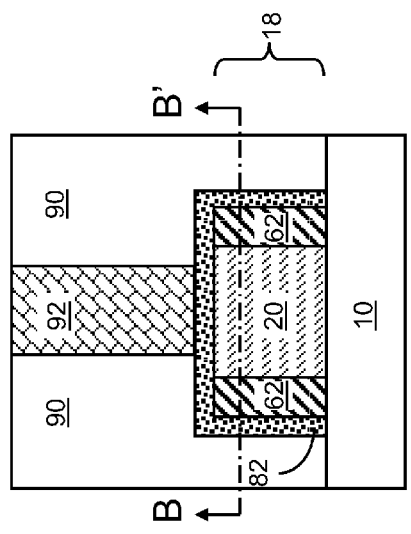
Figure 18F:
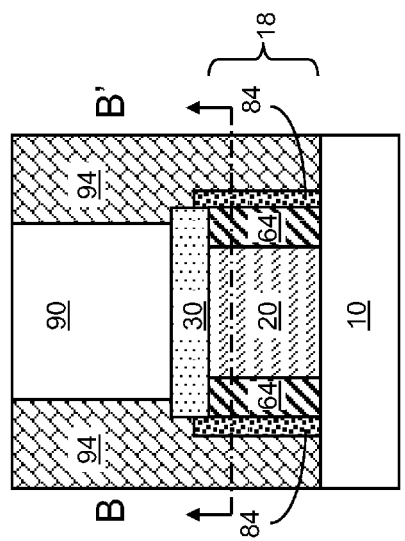

Referring to FIGS. 18A-18F, a fourth exemplary semiconductor structure according to a fourth embodiment of the present invention is derived from the first exemplary semiconductor structure by omitting the formation of the modified semiconductor region 72 at the processing step corresponding to FIGS. 5A-5F. Thus, the source-side metal semiconductor alloy portion 82 abuts the first and second source regions 62 and the portion of the body region 20 located between the first and second source regions 62. As in the previous embodiments, the HSSOI MOSFET may be oriented to take advantage of crystallographic orientations that may be selected from all possible orientations of the first and second sidewalls. The body region 20 of the HSSOI MOSFET is electrically connected to the source-side metal semiconductor alloy portion 82 directly.

Figure 19E:
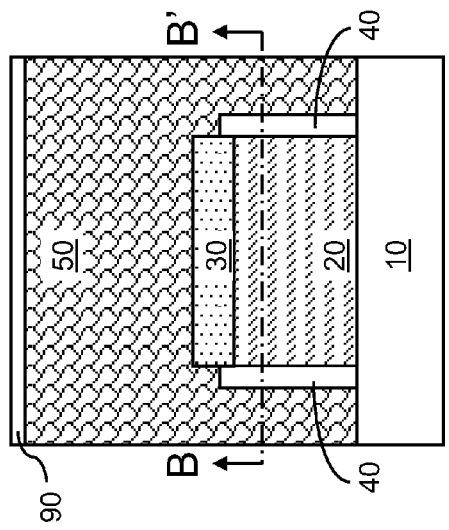
Figure 19D:
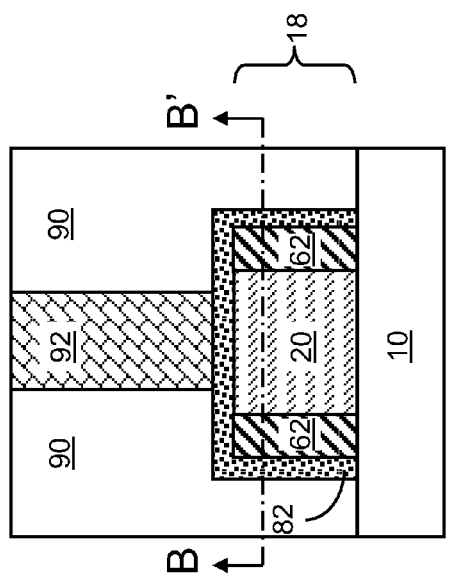
Figure 19F:
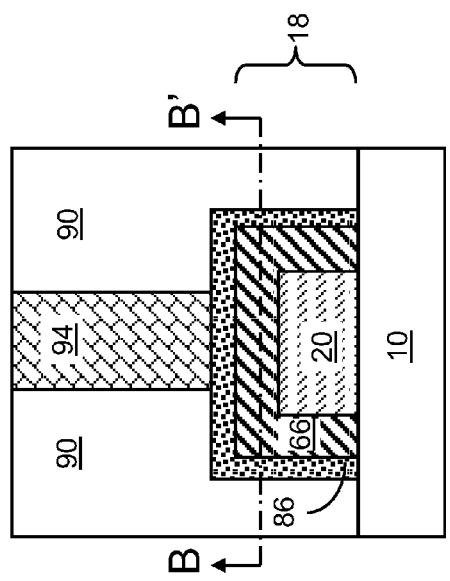

Referring to FIGS. 19A-19F, a fifth exemplary semiconductor structure according to a fifth embodiment of the present invention is derived from the second exemplary semiconductor structure by omitting the formation of the modified semiconductor region 72 at the processing step corresponding to FIGS. 11A-11F. Thus, the source-side metal semiconductor alloy portion 82 abuts the first and second source regions 62 and the portion of the body region 20 located between the first and second source regions 62. As in the previous embodiments, the HSSOI MOSFET may be oriented to take advantage of crystallographic orientations that may be selected from all possible orientations of the first and second sidewalls. The body region 20 of the HSSOI MOSFET is electrically connected to the source-side metal semiconductor alloy portion 82 directly.

Figure 20E:
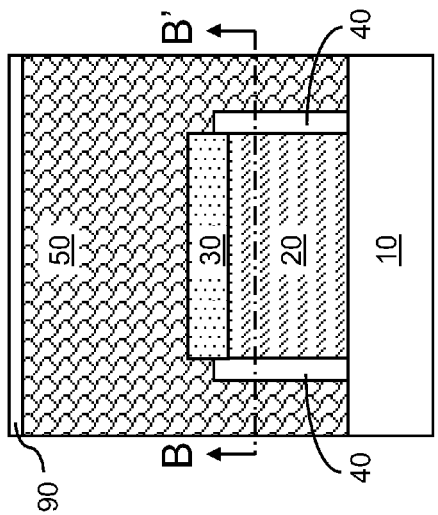
Figure 20D:
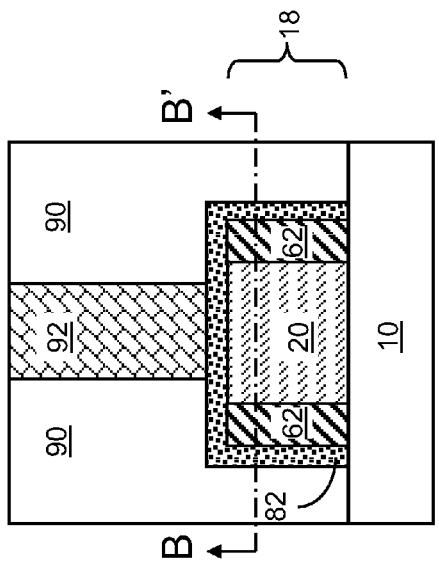
Figure 20F:
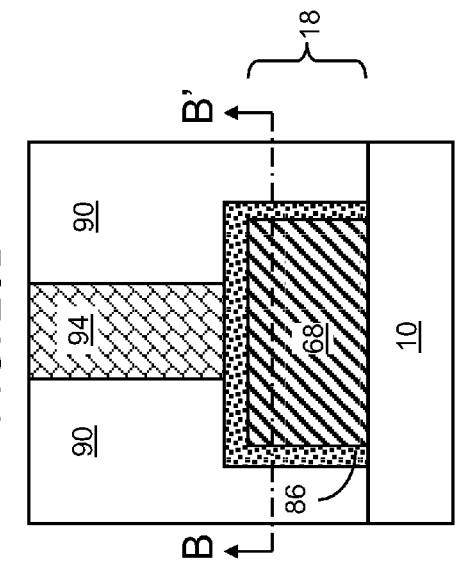

Referring to FIGS. 20A-20F, a sixth exemplary semiconductor structure according to a sixth embodiment of the present invention is derived from the third exemplary semiconductor structure by omitting the formation of the modified semiconductor region 72 at the processing step corresponding to FIGS. 11A-11F. Thus, the source-side metal semiconductor alloy portion 82 abuts the first and second source regions 62 and the portion of the body region 20 located between the first and second source regions 62. As in the previous embodiments, the HSSOI MOSFET may be oriented to take advantage of crystallographic orientations that may be selected from all possible orientations of the first and second sidewalls. The body region 20 of the HSSOI MOSFET is electrically connected to the source-side metal semiconductor alloy portion 82 directly.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
    forming a semiconductor fin having a first sidewall, a second sidewall, and a substantially horizontal top surface and located directly on an insulator layer and having a doping of a first conductivity type, wherein said first and second sidewalls are substantially parallel to each other and substantially vertical;
    forming a first source region having a doping of a second conductivity type directly beneath a portion of said first sidewall within a first end of said semiconductor fin and a second source region having a doping of said second conductivity type directly beneath a portion of said second sidewall within said first end of said semiconductor fin, wherein said second conductivity type is opposite to said first conductivity type, and said second source region is laterally spaced from, and not contacting, said first source region;
    forming a recombination-center-containing semiconductor region directly underneath a portion of said substantially horizontal top surface of said semiconductor fin having said doping of said first conductivity type at said first end, said recombination-center-containing semiconductor region laterally abutting said first source region and said second source region and including crystalline defects; and
    forming a metal semiconductor alloy portion directly on said recombination-center-containing semiconductor region, said first source region and said second source region.

2. The method of claim 1, wherein said recombination-center-containing semiconductor region comprises recombination-center-generating elements that do not add any additional free hole or any additional free electron.

3. The method of claim 2, wherein said recombination-center-generating elements are selected from nitrogen, oxygen, carbon, germanium, argon, krypton, xenon, gold, platinum, and a combination thereof.

4. The method of claim 2, wherein a thickness of said recombination-center-generating semiconductor region is less than a thickness of said semiconductor fin.

5. The method of claim 2, wherein a concentration of said recombination-center-generating elements is in a range from $1.0 \times 10^{11}/cm^3$ to $1.0 \times 10^{22}/cm^3$.

6. The method of claim 1, wherein said metal semiconductor alloy portion is formed as a structure that contiguously extends from a surface of said first source region to a surface of said second source region, and to said top surface of said portion of said semiconductor fin.

7. The method of claim 1, wherein said recombination-center-containing semiconductor region is formed by ion implantation of recombination-center-generating elements.

8. The method of claim 7, wherein said recombination-center-generating elements introduce damage to a crystalline structure to form said crystalline defects.

9. The method of claim 7, wherein said implantation of said recombination-center-generating element is performed without any tilt angle in a direction normal to said portion of said substantially horizontal top surface of said semiconductor fin.

10. The method of claim 7, wherein said recombination-center-generating elements are implanted into a first end wall of said semiconductor fin by angled ion implantation, said first end wall adjoined to one end of each of said first sidewall and said second sidewall at said first end of said semiconductor fin.

11. The method of claim 10, wherein a tilt angle of said ion implantation is set so that ions of said recombination-center-generating elements are implanted through said first end wall, while implantation of ions of said recombination-center-generating elements into a second end wall of said semiconductor fin is prevented, said second end wall adjoined to another end of each of said first sidewall and said second sidewall at a second end of said semiconductor fin opposite to said first end and substantially parallel to said first end wall.

12. The method of claim 11, further comprising forming a drain region within a second end of said semiconductor fin and having a doping of said second conductivity type, wherein said drain region does not abut said first and second source regions.

13. The method of claim 12, wherein said first source region, said second source region, and said drain region are formed by implantation of ions of said second conductivity type.

14. The method of claim 12, wherein said drain region is contiguous and includes a portion located directly beneath an entirety of said second end wall of said semiconductor fin.

15. The method of claim 12, further comprising forming another metal semiconductor alloy portion directly on said drain region.

16. The method of claim 12, further comprising:
providing a semiconductor-on-insulator (SOI) layer including said insulator layer and a top semiconductor layer; and
forming a dielectric fin cap layer on said top semiconductor layer.

17. The method of claim 16, further comprising:
forming a first gate dielectric directly on a middle portion of said first sidewall;
forming a second gate dielectric directly on a middle portion of said second sidewall; and
forming a gate conductor directly on said first gate dielectric, said second gate dielectric, and said dielectric fin cap portion.

18. The method of claim 16, further comprising patterning said dielectric fin cap layer and said top semiconductor layer, wherein a remaining portion of said dielectric fin cap layer constitutes a dielectric fin cap portion, wherein a remaining portion of said top semiconductor layer constitutes said semiconductor fin, and wherein said first sidewall and said second sidewall are substantially vertically coincident with sidewalls of said dielectric fin cap portion.

19. The method of claim 18, wherein said dielectric fin cap portion overlies an entirety of said drain region, and wherein an edge of said dielectric fin cap portion is substantially aligned to said gate conductor.

20. The method of claim 18, further comprising implanting dopants of said first conductivity type through a portion of said substantially horizontal top surface of said semiconductor fin located between said first source region and said second source region to form a first-conductivity-type doped region.

* * * * *